United States Patent
Kim et al.

(10) Patent No.: US 9,673,806 B2
(45) Date of Patent: Jun. 6, 2017

(54) GATE DRIVER AND DISPLAY DEVICE INCLUDING THE SAME

(71) Applicant: Samsung Display Co. Ltd., Yongin (KR)

(72) Inventors: Jong Hee Kim, Hwaseong-si (KR); Hyun Joon Kim, Yongin-si (KR); Cheol Gon Lee, Seoul (KR); Jae Keun Lim, Suwon-si (KR); Chong Chul Chai, Seoul (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 264 days.

(21) Appl. No.: 14/334,104

(22) Filed: Jul. 17, 2014

(65) Prior Publication Data

US 2015/0263722 A1 Sep. 17, 2015

(30) Foreign Application Priority Data

Mar. 13, 2014 (KR) ........................ 10-2014-0029690

(51) Int. Cl.
| | |
|---|---|
| *G09G 5/00* | (2006.01) |
| *H03K 17/16* | (2006.01) |
| *H03K 17/687* | (2006.01) |
| *H03K 17/00* | (2006.01) |
| *G09G 3/3266* | (2016.01) |

(52) U.S. Cl.
CPC ......... *H03K 17/162* (2013.01); *G09G 3/3266* (2013.01); *H03K 17/002* (2013.01); *H03K 17/6871* (2013.01); *G09G 2310/0286* (2013.01); *G09G 2320/045* (2013.01)

(58) Field of Classification Search
CPC ... G09G 3/3677; G09G 3/3266; G09G 3/3648
USPC ......................................... 345/213, 214, 690
See application file for complete search history.

(56) References Cited

U.S. PATENT DOCUMENTS

| | | | |
|---|---|---|---|
| 2007/0188196 A1 | 8/2007 | Yu | |
| 2010/0013823 A1* | 1/2010 | Kwon | G09G 3/3674 345/214 |
| 2011/0148853 A1* | 6/2011 | Ko | G09G 3/3677 345/213 |
| 2016/0268004 A1* | 9/2016 | Li | G11C 19/28 |

FOREIGN PATENT DOCUMENTS

| | | | | |
|---|---|---|---|---|
| CN | WO2014166251 A1 * | 10/2014 | ......... | G09G 3/3648 |
| JP | 2009-188867 | 8/2009 | | |
| KR | 1020080064531 | 7/2008 | | |

* cited by examiner

*Primary Examiner* — Calvin C Ma
(74) *Attorney, Agent, or Firm* — Cantor Colburn LLP

(57) ABSTRACT

A gate driver includes a plurality of stages connected to each other in a cascade manner, where each of the stages includes an input unit which connects a first input terminal and a first node and includes a first input transistor and a second input transistor, where an output terminal of the first input transistor and an input terminal of the second input transistor are connected to a second node, and the input unit further includes a storage capacitor which connects the first input terminal and the second node.

17 Claims, 20 Drawing Sheets

GATE DRIVER AND DISPLAY DEVICE INCLUDING THE SAME

This application claims priority to Korean Patent Application No. 10-2014-0029690 filed on Mar. 13, 2014, and all the benefits accruing therefrom under 35 U.S.C. §119, the content of which in its entirety is herein incorporated by reference.

BACKGROUND

1. Field

The invention relates to a display device, and more particularly, to a display device including a gate driver integrated therein.

2. Description of the Related Art

A display device typically includes a plurality of pixels arranged in a matrix form. The display device may display a color and a grayscale level based on a data signal transmitted to each of the pixels. The display device may include a data driver which generates a data signal transmitted to each of the pixels. The data driver may generate data signals corresponding to an image that is to be displayed on the display device.

Each of the pixels included in the display device may determine whether to receive a data signal based on a gate signal. The display device may include a gate driver which generates gate signals. The gate driver may include a plurality of shift registers. The shift registers may be driven sequentially to generate a gate-on signal that enables each of the pixels to receive a data signal.

Each of the shift registers included in the gate driver may include a plurality of transistors. Characteristics of each of the transistors may vary according to a change in the surrounding environment. For example, as a voltage between a drain and a source of a transistor increases, the transistor may be degraded. The degradation of the transistor may lower a level of a start signal, which, in turn, reduces the size of an output signal. Consequently, the display device may not effectively display a desired image.

SUMMARY

Exemplary embodiments of the invention provide a gate driver in which degradation of transistors is effectively prevented, and a display device including the gate driver.

According to an exemplary embodiment of the invention, a gate driver includes a plurality of stages connected to each other in a cascade manner, where each of the stages includes an input unit which connects a first input terminal and a first node and includes a first input transistor and a second input transistor, where an output terminal of the first input transistor and an input terminal of the second input transistor are connected to a second node, and the input unit further includes a storage capacitor which connects the first input terminal and the second node.

In an exemplary embodiment, each of the stages may further include an inverter unit which connects a clock terminal and a third node and includes plurality of transistors, an output unit which connects the first node and a first output terminal and includes an output transistor and an output capacitor, a carry signal generation unit which connects the clock terminal and a second output terminal, a noise elimination unit which connects a second power source terminal and the second output terminal and includes a transistor, and a pull-down unit which applies a voltage of a first power source terminal to the first output terminal or the second output terminal in response to a signal transmitted to a second input terminal.

In an exemplary embodiment, a carry signal of a previous stage may be transmitted to the first input terminal of a current stage, a carry signal of a next stage may be transmitted to the second input terminal of the current stage, the first output terminal may output a gate signal of the current stage, and the second output terminal of the current stage may output a carry signal of the current stage.

In an exemplary embodiment, a clock signal may be transmitted to the clock terminal, a first gate-off signal may be transmitted to the first power source terminal, and a second gate-off signal may be transmitted to the second power source terminal.

In an exemplary embodiment, input terminals of the plurality of transistors of the inverter unit may be connected to the clock terminal, and output terminals of the plurality of transistors of the inverter unit may be connected to the second power source terminal.

In an exemplary embodiment, each of the first and second transistors of the input unit, the plurality of transistors of the inverter unit, the output transistor of the output unit and the transistor of the noise elimination unit may include an oxide semiconductor.

In an exemplary embodiment, a control terminal of the first input transistor and a control terminal of the second input transistor may be diode-connected to an input terminal of the first input transistor and the input terminal of the second input transistor.

According to another exemplary embodiment of the invention, there is provided a gate driver including a plurality of stages connected to each other in a cascade manner, where each of the stages includes an input unit which connects a first input terminal and a first node and includes a first input transistor and a second input transistor, where an output terminal of the first input transistor and an input terminal of the second input transistor are connected to a second node, and the input unit further includes a storage capacitor which connects a clock terminal and the second node.

In an exemplary embodiment, each of the stages may further include an inverter unit which connects the clock terminal and a third node and may include plurality of transistors, an output unit which connects the first node and a first output terminal and may include an output transistor and an output capacitor, a carry signal generation unit which connects the clock terminal and a second output terminal, a noise elimination unit which connects a second power source terminal and the second output terminal and may include a transistor, and a pull-down unit which applies a voltage of a first power source terminal to the first output terminal or the second output terminal in response to a signal transmitted to a second input terminal.

In an exemplary embodiment, a carry signal of a previous stage may be transmitted to the first input terminal of a current stage, a carry signal of a next stage may be transmitted to the second input terminal of the current stage, the first output terminal may output a gate signal of the current stage, and the second output terminal of the current stage may output a carry signal of the current stage.

In an exemplary embodiment, a clock signal may be transmitted to the clock terminal, a first gate-off signal may be transmitted to the first power source terminal, and a second gate-off signal may be transmitted to the second power source terminal.

In an exemplary embodiment, input terminals of the plurality of transistors of the inverter unit may be connected to the clock terminal, and output terminals of the plurality of transistors of the inverter unit may be connected to the second power source terminal.

In an exemplary embodiment, each of the first and second transistors of the input unit, the plurality of transistors of the inverter unit, the output transistor of the output unit and the transistor of the noise elimination unit may include an oxide semiconductor.

In an exemplary embodiment, a control terminal of the first input transistor and a control terminal of the second input transistor may be diode-connected to an input terminal of the first input transistor and the input terminal of the second input transistor.

According to still another exemplary embodiment of the invention, there is provided a display device including a display panel, and a gate driver which provides gate signals to the display panel, where the gate driver includes a plurality of stages connected to each other in a cascade manner, where each of the stages includes an input unit which connects a first input terminal and a first node and includes a first input transistor and a second input transistor, where an output terminal of the first input transistor and an input terminal of the second input transistor are connected to a second node, and the input unit further includes a storage capacitor which connects the first input terminal and the second node.

In an exemplary embodiment, each of the stages may further include an inverter unit which connects a clock terminal and a third node and may include plurality of transistors, an output unit which connects the first node and a first output terminal and may include an output transistor and an output capacitor, a carry signal generation unit which connects the clock terminal and a second output terminal, a noise elimination unit which connects a second power source terminal and the second output terminal and includes a transistor, and a pull-down unit which applies a voltage of a first power source terminal to the first output terminal or the second output terminal in response to a signal transmitted to a second input terminal.

In an exemplary embodiment, a carry signal of a previous stage may be transmitted to the first input terminal of a current stage, a carry signal of a next stage may be transmitted to the second input terminal of the current stage, the first output terminal outputs a gate signal of the current stage, and the second output terminal of the current stage outputs a carry signal of the current stage.

In an exemplary embodiment, a clock signal may be transmitted to the clock terminal, a first gate-off signal may be transmitted to the first power source terminal, and a second gate-off signal may be transmitted to the second power source terminal.

In an exemplary embodiment, each of the first and second transistors of the input unit, the plurality of transistors of the inverter unit, the output transistor of the output unit and the transistor of the noise elimination unit may include an oxide semiconductor.

In an exemplary embodiment, a control terminal of the first input transistor and a control terminal of the second input transistor may be diode-connected to an input terminal of the first input transistor and the input terminal of the second input transistor.

BRIEF DESCRIPTION OF THE DRAWINGS

The above and other d features of the invention will become more apparent by describing in detail exemplary embodiments thereof with reference to the attached drawings, in which.

DETAILED DESCRIPTION

Figure 1:
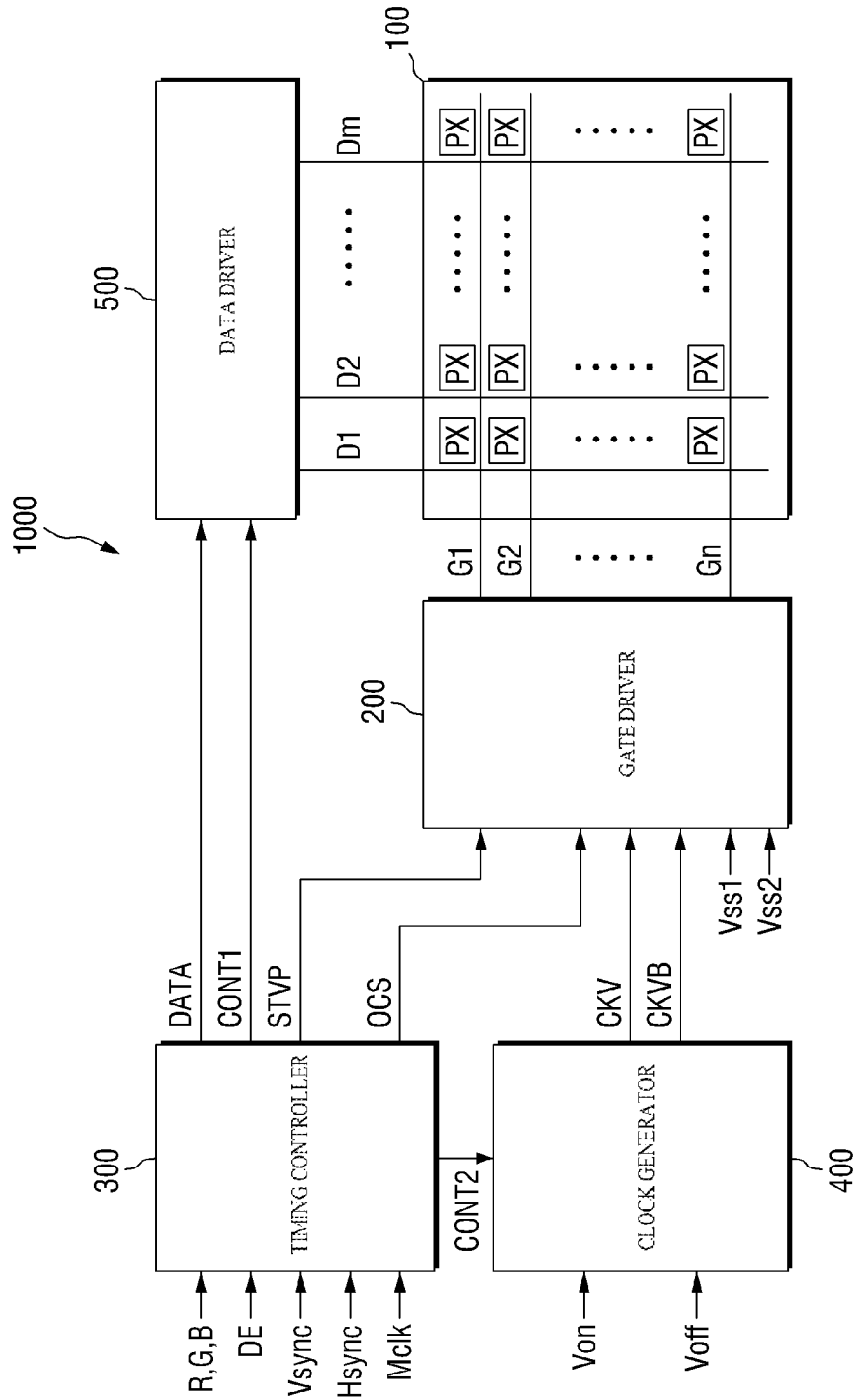
FIG. 1 is a block diagram of an exemplary embodiment of a display device according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described with reference to the attached drawings.

FIG. 1 is a block diagram of an exemplary embodiment of a display device 1000 according to the invention.

In an exemplary embodiment, the display device 1000 includes a display panel 100 and a gate driver 200.

The display panel 100 may include a plurality of gate lines G1 through Gn, a plurality of data lines D1 through Dm, and a plurality of pixels PX connected to the gate lines G1 through Gn and the data lines D1 through Dm. Here, n and m are positive integer. In an exemplary embodiment, the pixels PX may be disposed in areas defined by the gate lines G1 through Gn and the data lines D1 through Dm. The pixels PX may display grayscale levels corresponding to data signals transmitted to the data lines D1 through Dm and determine whether to receive the data signals based on gate signals transmitted to the gate lines G1 through Gn. The pixels PX will now be described in greater detail with reference to FIG. 2.

Figure 2:
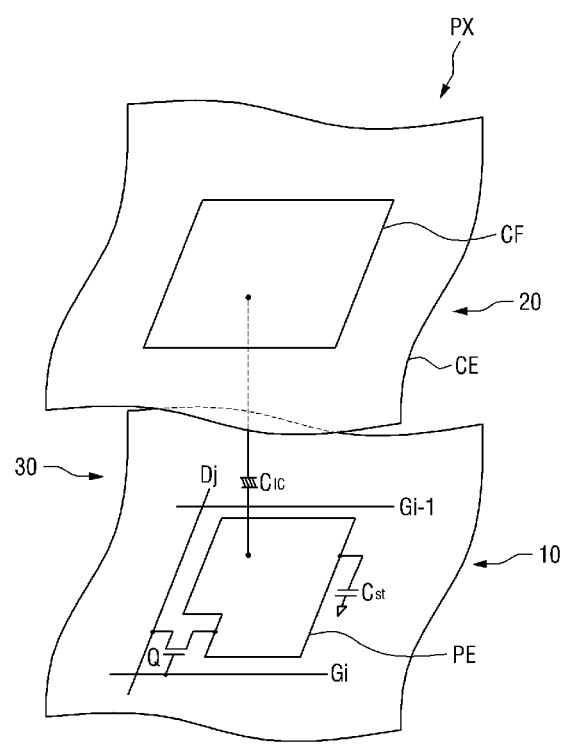
FIG. 2 is an equivalent circuit diagram of an exemplary embodiment of a pixel illustrated in FIG. 1.

FIG. 2 is a circuit diagram of an exemplary embodiment of a pixel PX according to the invention. In FIG. 2, a circuit diagram of an exemplary embodiment a pixel PX of the display panel 100, where the display panel 100 is a liquid crystal panel, are shown for convenience of illustration, but not being limited thereto. In an alternative exemplary embodiment, the display panel 100 may be an organic electroluminescent display panel, a plasma display panel, a field emission display panel, an electrophoretic display panel, or the like, for example.

Referring to FIG. 2, in an exemplary embodiment, a color filter CF may be disposed on a region of a common electrode CE of a second substrate 20 to face a pixel electrode PE of a first substrate 10. In such an embodiment, a pixel PX connected to an $i^{th}$ gate line Gi (i=1 to n) and a $j^{th}$ data line Dj (j=1 to m) may include a switching element Q which is connected to the $i^{th}$ gate line Gi and the $j^{th}$ data line Dj, and a liquid crystal capacitor Clc and a storage capacitor Cst which are connected to the switching element Q. In an alternative exemplary embodiment, the storage capacitor Cst may be omitted. In one exemplary embodiment, for example, the switching element Q may be an amorphous silicon thin-film transistor ("a-Si TFT"). In an exemplary embodiment, as shown in FIG. 2, the color filter CF is disposed on the second substrate 20 having the common electrode CE. However, the invention is not limited thereto, and in an alternative exemplary embodiment, the color filter CF may be disposed on the first substrate 10.

The switching element Q may be a thin-film transistor. The switching element Q may have a gate connected to the $i^{th}$ gate line Gi, a source connected to the $j^{th}$ data line Dj, and a drain connected to a terminal of each of the liquid crystal capacitor Clc and the storage capacitor Cst. The switching element Q may determine whether to transmit a data signal transmitted to the $j^{th}$ data line Dj, to the terminal of each of the liquid crystal capacitor Clc and the storage capacitor Cst in response to a gate signal transmitted to the $i^{th}$ gate line Gi.

The liquid crystal capacitor Clc may be a virtual capacitor defined by a capacitance component of a liquid crystal layer 30 interposed between the pixel electrode PE to which a data signal is transmitted and the common electrode CE to which a common voltage is applied. The light transmittance of the liquid crystal layer may be controlled by a potential difference between both terminals of the liquid crystal capacitor Clc. A terminal (e.g., a first terminal) of the liquid crystal capacitor Clc may be connected to the drain of the switching element Q, and the common voltage may be applied to the other terminal (e.g., a second terminal) of the liquid crystal capacitor Clc.

A terminal (e.g., a first terminal) of the storage capacitor Cst may be connected to the drain of the switching element Q, and the common voltage may be applied to the other terminal (e.g., a second terminal) of the storage capacitor Cst. In such an embodiment, the storage capacitor Cst may be connected in parallel with the liquid crystal capacitor Clc. The storage capacitor Cst may increase the capacitance between the pixel electrode PE and the common electrode CE such that voltages applied to both terminals of the liquid crystal capacitor Clc may be effectively maintained when the switching element Q is turned off. In an alternative exemplary embodiment, the storage capacitor Cst may be omitted.

Referring back to FIG. 1, the gate driver 200 may provide a gate signal to each of the gate lines G1 through Gn using a start pulse signal STVP, an output control signal OCS, a clock signal CKV, an inverted clock signal CKVB, a first gate-off voltage Vss1 and a second gate-off voltage Vss2. The gate driver 200 will be described in greater detail later with reference to FIG. 3.

In an exemplary embodiment, as shown in FIG. 1, the display device 1000 may further include a timing controller 300, a data driver 500 and a clock generator 400.

The timing controller 300 may receive an input image signal R, G, B and input control signals for controlling the display of the input image signal R, G, B. The timing controller 300 may generate an image data signal DATA and a data driver control signal CONT1 based on the input image signal R, G, B and the input control signals, and provide the image data signal DATA and the data driver control signal CONT1 to the data driver 500. The timing controller 300 may receive the input control signals such as a horizontal synchronization signal Hsync, a main clock signal Mclk and a data enable signal DE, and output the data driver control signal CONT1 based thereon. The data driver control signal CONT1 for controlling the operation of the data driver 500 may include a horizontal start signal for starting the operation of the data driver 500 and a load signal for instructing the output of data voltages. The timing controller 300 may generate a clock generation control signal CONT2 based on the input image signal R, G, B and the input control signals, and provide the clock generation control signal CONT2 to the clock generator 400. The clock generation control signal CONT2 may include a gate clock signal for determining the output timing of a gate-on voltage Von and an output enable signal for determining a pulse width of the gate-on voltage Von. The timing controller 300 may generate the start pulse signal STVP and the output control signal OCS based on the input image signal R, G, B and the input control signals, and provide the start pulse signal STVP and the output control signal OCS to the gate driver 200.

The data driver 500 may receive the image data signal DATA and the data driver control signal CONT1, and provide data signals corresponding to the image data signal DATA to the data lines D1 through Dm.

The clock generator 400 may generate the clock signal CKV and the inverted clock signal CKVB in response to the clock generation control signal CONT2. The inverted clock signal CKVB may be an inverted signal of the clock signal CKV or a signal having a delay of half a period.

An exemplary embodiment of the gate driver 200 will now be described in greater detail with reference to FIG. 3.

Figure 3:
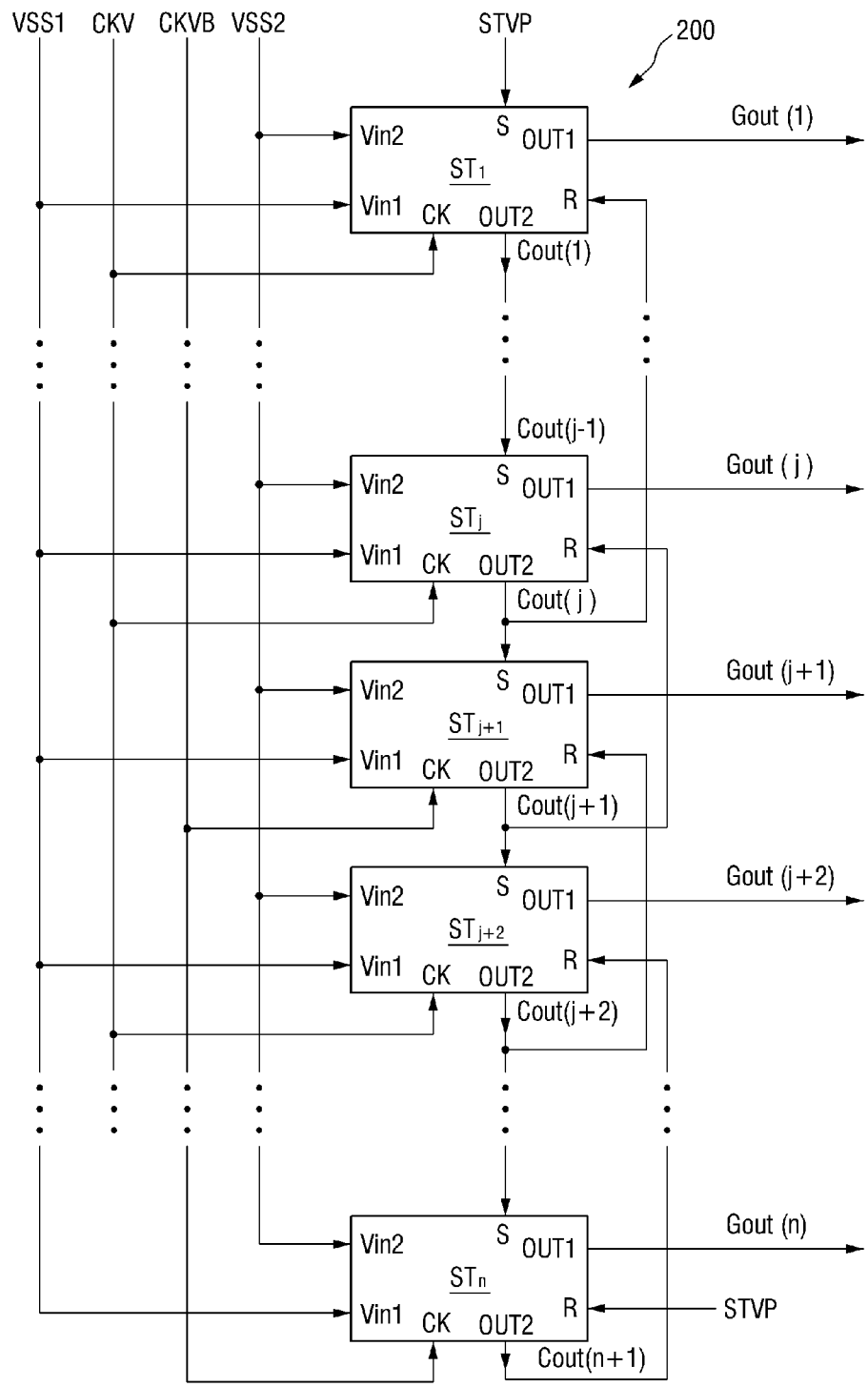
FIG. 3 is a block diagram of an exemplary embodiment of a gate driver according to the invention.

FIG. 3 is a block diagram of an exemplary embodiment of the gate driver 200 according to the invention.

Referring to FIG. 3, the gate driver 200 may include first through $n^{th}$ stages $ST_1$ through $ST_n$ connected in a cascade manner. Each of the first through $n^{th}$ stages $ST_1$ through $ST_n$ may include a first power source terminal Vin1, a second power source terminal Vin2, a clock terminal CK, a gate output terminal OUT1, a carry signal output terminal OUT2, a first input terminal S, and a second input terminal R.

In one exemplary embodiment, for example, a carry signal Cout(j−1) of a previous stage, e.g., a (j−1)-th stage $ST_{j-1}$ (not shown), may be input to the first input terminal S of a current stage, e.g., a j-th stage $ST_j$ connected to a j-th gate line Gj (j≠1), a carry signal Cout(j+1) of a next stage, e.g., a (j+1)-th stage $ST_{j+1}$, may be input to the second input terminal R of the current stage, e.g., the $j^{th}$ stage $ST_j$, and the clock signal CKV and the inverted clock signal CKVB may be input to the clock terminal CK of the current stage, e.g., the j-th stage $ST_j$. In such an embodiment, the first gate-off voltage Vss1 may be input to the first power source terminal Vin1 of each of the first through $n^{th}$ stages $ST_1$ through $ST_n$, the second gate-off voltage Vss2 may be input to the second power source terminal Vin2 of each of the first through $n^{th}$ stages $ST_1$ through $ST_n$, and the output control signal OCS (not shown) may be provided to the first stage $ST_1$. The gate output terminal OUT1 may output a gate signal Gout(j), and the carry signal output terminal OUT2 may output a carry signal Cout(j).

In such an embodiment, the start pulse signal STVP, instead of a carry signal of a previous stage, may be input to the first input terminal S of the first stage $ST_1$. In such an embodiment, the start pulse signal STVP, instead of a carry signal of a next stage, may be input to the second input terminal R of the last stage $ST_n$.

The clock signal CKV and the inverted clock signal CKVB generated by the clock generator 400 may be input to the clock terminal CK. A high selection of the clock signal CKV provided to the clock terminal CK may be output from the gate output terminal OUT1 of each of the first through $n^{th}$ stages $ST_1$ through $ST_n$. The clock signal CKV may be transmitted to odd-numbered stages ($ST_1$, $ST_3$, . . . ), and a high section of the clock signal CKV may be output from the gate output terminal OUT1 of each of the odd-numbered stages. In addition, the clock signal CKV may be transmitted to even-numbered stages ($ST_2$, $ST_4$, . . . ), and a high section of the inverted clock signal CKVB may be output from the gate output terminal OUT1 of each of the even-numbered stages. In an exemplary embodiment, when j is an odd number and n is an even number, as shown in FIG. 3, the j-th stage $ST_j$ receives the clock signal CKV, the (j+1)-th stage $ST_{j+1}$ receives the inverted clock signal CKVB, the (j+2)-th stage $ST_{j+2}$ receives the clock signal CKV, and the n-th stage $ST_n$ receives the inverted clock signal CKVB.

In such an embodiment, as described above, the first through $n^{th}$ stages $ST_1$ through $ST_n$ may sequentially output gate signals Gout(1) through Gout(n).

The signals Gout(1) through Gout(n) output from the gate output terminals OUT1 of the first through $n^{th}$ stages $ST_1$ through $ST_n$ may be gate signals transmitted to the first through n-th gate lines G1 through Gn, respectively.

The first power source terminal Vin1 of each of the first through $n^{th}$ stages $ST_1$ through $ST_n$ may be connected to the first gate-off voltage Vss1, and the second power source terminal Vin2 of each of the first through $n^{th}$ stages $ST_1$ through $ST_n$ may be connected to the second gate-off voltage Vss2.

Figure 4:
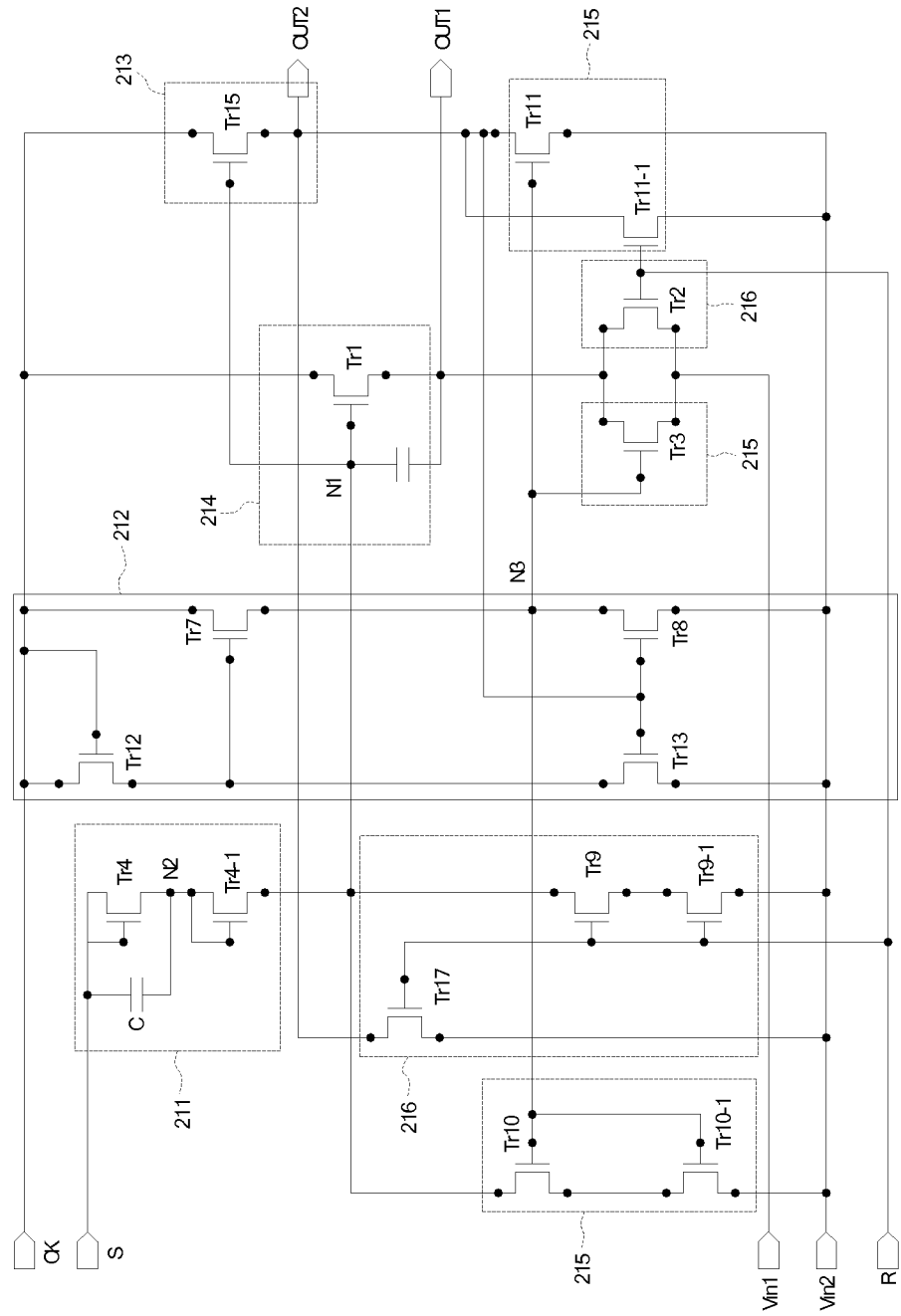
FIG. 4 is a circuit diagram of an exemplary embodiment of a stage of the gate driver according to the invention.
Figure 5:
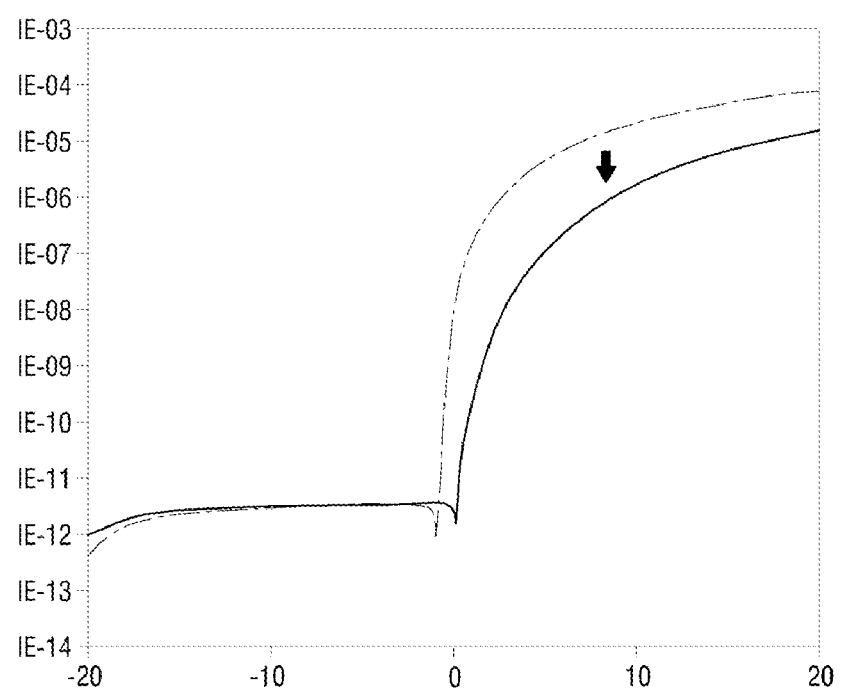
FIG. 5 is a graph of current versus voltage of an oxide semiconductor in an exemplary embodiment of the gate driver according to the invention.
Figure 6:
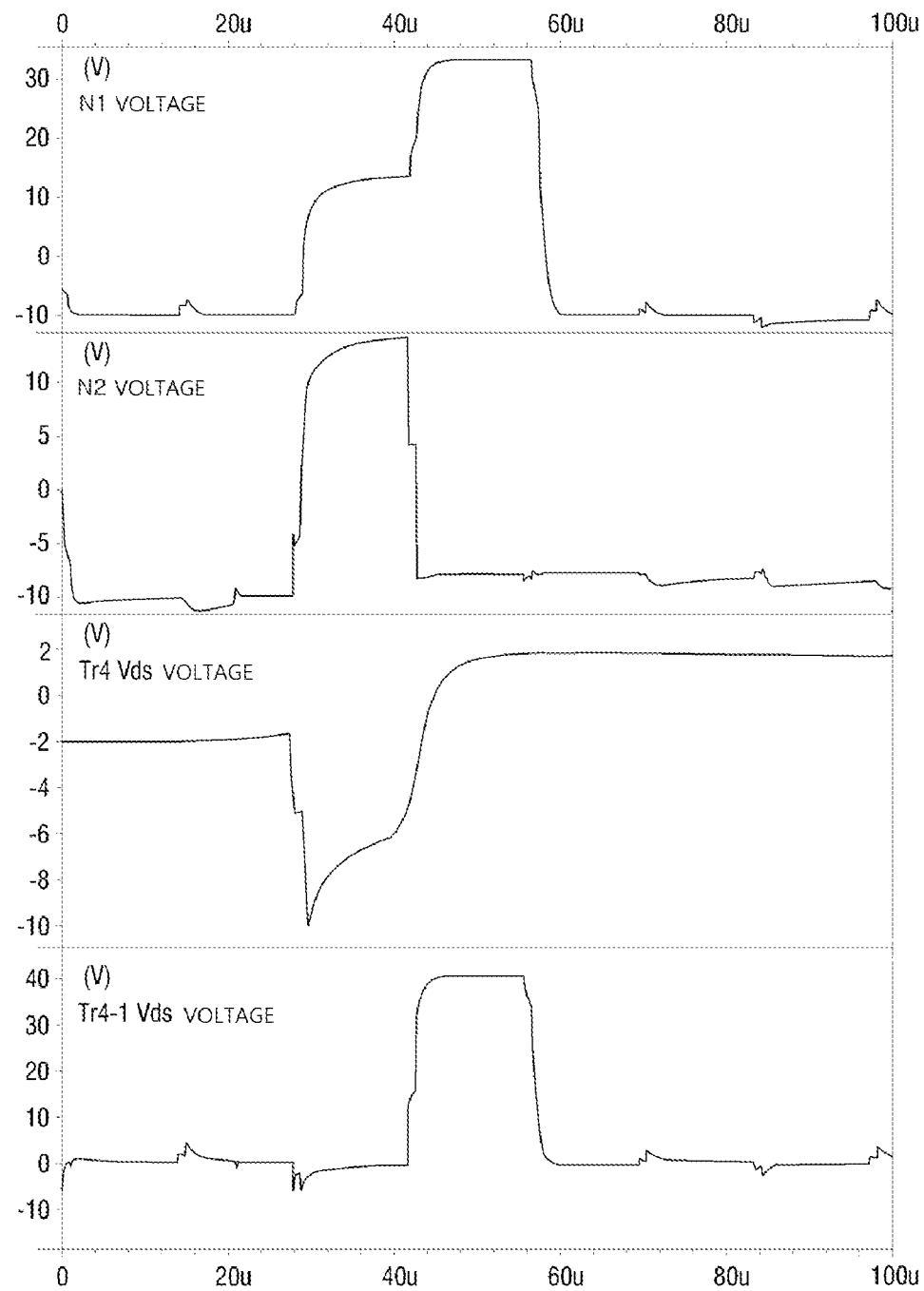
FIG. 6 is a timing diagram illustrating the variation in voltage level of a circuit of a stage where a storage capacitor is not provided.
Figure 7:
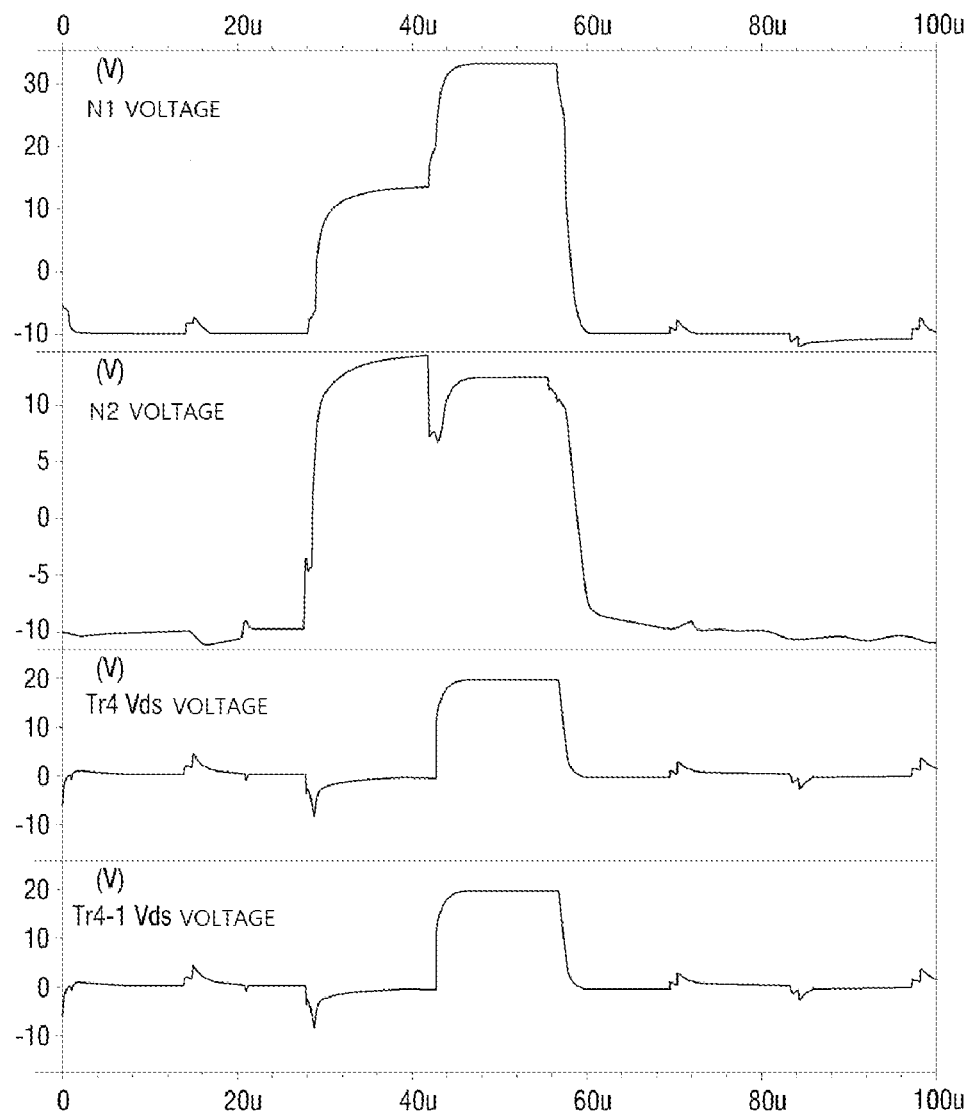
FIG. 7 is a timing diagram illustrating the variation in voltage level of a circuit of a an exemplary embodiment of a stage according to the invention.

Stages included in the gate driver 200 will now be described in greater detail with reference to FIG. 4. FIG. 4 is a circuit diagram of an exemplary embodiment of a stage of the gate driver 200 according the invention. FIG. 5 is a graph of current versus voltage of an oxide semiconductor in an exemplary embodiment of the gate driver 200 according to the invention. FIG. 6 is a timing diagram illustrating operating characteristics of a gate driver using an oxide semiconductor. FIG. 7 is a timing diagram illustrating operating characteristics of an exemplary embodiment of the gate driver 200 according to the invention.

Referring to FIG. 4, each stage of an exemplary embodiment of the gate driver 200 may include an input unit 211, an inverter unit 212, a carry signal generation unit 213, an output unit 214, a noise elimination unit 215, and a pull-down unit 216. In such an embodiment, the gate driver 200 may include a plurality of transistors and a plurality of capacitors.

The input unit 211 may connect a first input terminal S and a first node N1, and include a pair of fourth transistor including a fourth transistor (e.g., a first fourth transistor) Tr4 and additional fourth transistor (e.g., a second fourth transistor) Tr4-1. An output terminal of the fourth transistor Tr4 and an input terminal of the additional fourth transistor Tr4-1 may be connected to a second node N2, and the input unit 211 may include a storage capacitor C which connects the first input terminal S and the second node N2. An input terminal of the fourth transistor Tr4 may be connected to the first input terminal S, and an output terminal of the additional fourth transistor Tr4-1 may be connected to the first node N1. A control terminal of the fourth transistor Tr4 and a control terminal of the additional fourth transistor Tr4-1 may be commonly connected (diode-connected) to the input terminal of the fourth transistor Tr4 and the input terminal of the additional fourth transistor Tr4-1.

When receiving a high voltage from the first input terminal S, the input unit 211 may deliver the high voltage to the first node N1. Since the fourth transistor Tr4 and the additional fourth transistor Tr4-1 are connected to each other in series, a voltage (hereinafter, referred to as an "input unit voltage") difference between the first input terminal S and the first node N1 may be shared by the fourth transistor Tr4 and the additional fourth transistor Tr4-1. Therefore, a leakage current at the second node N2 may be reduced.

The storage capacitor C of the input unit 211 may maintain a voltage of the second node N2 for a certain period of time. When the additional fourth transistor Tr4-1 is additionally provided in the input unit 211 along with the fourth transistor Tr4, voltages applied to the fourth transistor Tr4 and the additional fourth transistor Tr4-1 may be different from each other, and the improvement of the display quality may be thereby limited. In an exemplary embodiment, the storage capacitor C which connects the first input terminal S and the second node N2 is additionally included to allow the fourth transistor Tr4 and the additional fourth transistor Tr4-1 to share stress applied thereto. The variation in the level of a voltage applied to each of the first node N1, the second node N2, the fourth transistor Tr4, and the additional fourth transistor Tr4-1 will now be described in detail with reference to FIGS. 6 through 8.

FIG. 6 is a timing diagram illustrating the variation in voltage level of a circuit in a stage where the storage capacitor C is not provided between the first input terminal S and the second node N2. FIG. 7 is a timing diagram illustrating the variation in voltage level of a circuit in an exemplary embodiment of a gate driver according to the invention.

A first graph of FIG. 6 illustrates the variation in voltage level of the first node N1, a second graph illustrates the variation in voltage level of the second node N2, a third graph illustrates the level of a voltage between a drain and a source (hereinafter, referred to as a "Vds voltage") of the fourth transistor Tr4, and a fourth graph illustrates the level of the Vds voltage of the additional fourth transistor Tr4-1.

Referring to the first graph of FIG. 6, the fourth and additional fourth transistors Tr4 and Tr4-1 may be turned on by a carry signal of a previous stage and apply a voltage of the carry signal of the previous stage to the first node N1. In an exemplary embodiment, as shown in FIG. 4, the first node N1 is connected to an output capacitor, and the output capacitor may store the voltage of the carry signal of the previous stage. Then, a fifteenth transistor Tr15 in the carry signal generation unit 213 may deliver a voltage of the clock signal CKV to the first node N1 in response to the clock signal CKV. Thus, a boosted-up voltage may be applied to the first node N1. Next, a pair of ninth transistors, e.g., ninth and additional ninth transistors Tr9 and Tr9-1, may be turned on by a carry signal of a next stage and apply the second gate-off voltage Vss2 to the first node N1. Thus, the first node N1 may have a negative voltage.

Referring to the second graph of FIG. 6, the fourth transistor Tr4 and the additional fourth transistor Tr4-1 may apply a voltage corresponding to the carry signal of the previous stage to the second node N2 in response to the carry signal of the previous stage.

In FIG. 6, the third graph shows the Vds voltage of the fourth transistor Tr4. Since the fourth transistor Tr4 and the additional fourth transistor Tr4-1 are connected to each other in series, a voltage corresponding to half a voltage difference between the first node N1 and the first input terminal S is applied to each of the fourth transistor Tr4 and the additional fourth transistor Tr4-1. However, a voltage of approximately 2 volts (V) may be applied to the fourth transistor Tr4 during a section in which the first node N1 is boosted up.

In FIG. 6, the fourth graph shows the Vds voltage of the additional fourth transistor Tr4-1. A voltage obtained by subtracting a voltage applied to the fourth transistor Tr4 from a voltage difference between the first node N1 and the first input terminal S may be applied to the additional fourth transistor Tr4-1. However, a voltage of approximately 40 V may be applied to the additional fourth transistor Tr4-1 during a section in which the first node N1 is boosted up.

That is, the fourth transistor Tr4 and the additional fourth transistor Tr4-1 cannot equally share a voltage between the first node N1 and the first input terminal S. In particular, most of the voltage difference between the first node N1 and the first input terminal S may be applied to the additional fourth transistor Tr4-1, thereby degrading the additional fourth transistor Tr4-1.

FIG. 7 is a timing diagram illustrating the variation in voltage level of a circuit in an exemplary embodiment of the stage where the storage capacitor C is connected to the first input terminal S and the second node N2. A first graph of FIG. 7 illustrates the variation in voltage level of the first node N1, a second graph illustrates the variation in voltage level of the second node N2, a third graph illustrates the level of the Vds voltage of the fourth transistor Tr4, and a fourth graph illustrates the level of the Vds voltage of the additional fourth transistor Tr4-1.

Referring to the first graph of FIG. 7, the fourth and additional fourth transistors Tr4 and Tr4-1 may be turned on by a carry signal of a previous stage and apply a voltage of the carry signal of the previous stage to the first node N1. Since the first node N1 includes an output capacitor, the output capacitor may store the voltage of the carry signal of the previous stage. Then, the fifteenth transistor Tr15 may deliver a voltage of the clock signal CKV to the first node N1 in response to the clock signal CKV. Thus, a boosted-up voltage may be applied to the first node N1. Next, the pair of ninth transistors Tr9 and Tr9-1 may be turned on by a carry signal of a next stage and apply the second gate-off voltage Vss2 to the first node N1. Thus, the first node N1 may have a negative voltage.

Referring to the second graph of FIG. 7, the fourth transistor Tr4 and the additional fourth transistor Tr4-1 may apply a voltage corresponding to the carry signal of the previous stage to the second node N2 in response to the carry signal of the previous stage. Since the second node N2 is connected to the first input terminal S by the storage capacitor C, the voltage of the second node N2 may be maintained substantially constant during a period in which the first node N1 is boosted up.

Referring to the third and fourth graphs of FIG. 7, the Vds voltages of the fourth transistor Tr4 and the additional fourth transistor Tr4-1 are illustrated. In an exemplary embodiment, since the fourth transistor Tr4 and the additional fourth transistor Tr4-1 are connected to each other in series and the voltage of the second node N2 is maintained substantially constant by the storage capacitor C, a voltage corresponding to half a voltage difference between the first node N1 and the first input terminal S may be applied to each of the fourth transistor Tr4 and the additional fourth transistor Tr4-1.

In such an embodiment, the fourth transistor Tr4 and the additional fourth transistor Tr4-1 may equally share a voltage between the first node N1 and the first input terminal S. In such an embodiment, since each of the fourth transistor Tr4 and the additional fourth transistor Tr4-1 may operate in a safety region, the degradation thereof may be effectively prevented.

Referring back to FIG. 4, in an exemplary embodiment of a stage, the inverter unit 212 may include a twelfth transistor Tr12, a seventh transistor Tr7, an eighth transistor Tr8 and a thirteenth transistor Tr13. The twelfth transistor Tr12 may have a control terminal and an input terminal that are diode-connected to each other. The input terminal of the twelfth transistor Tr12 may be connected to the clock terminal CK, and an output terminal of the twelfth transistor Tr12 may be connected to a control terminal of the seventh transistor Tr7 and an input terminal of the thirteenth transistor Tr13. The seventh transistor Tr7 may have the control terminal connected to the output terminal of the twelfth transistor Tr12, an input terminal connected to the clock terminal CK, and an output terminal connected to a third node N3. The eighth transistor Tr8 may have a control terminal connected to the carry signal output terminal OUT2 of a current stage, an input terminal connected to the third node N3, and an output terminal connected to the second power source terminal Vin2. The thirteenth transistor Tr13 may have the input terminal connected to the output terminal of the twelfth transistor Tr12, a control terminal connected to the carry signal output terminal OUT2 of the current stage, and an output terminal connected to the second power source terminal Vin2. In such an embodiment, a high voltage transmitted to the inverter unit 212 as the clock signal CKV may be delivered to the input terminals of the eighth and thirteenth transistors Tr8 and Tr13 by the twelfth and seventh transistors Tr12 and Tr7. Accordingly, the third node N3 may have a high voltage, and the delivered high signal may lower a voltage of the third node N3 to the second gate-off voltage Vss2 when a carry signal is output from the carry signal output terminal OUT2 of the current stage. As a result, the third node N3 of the inverter unit 212 may have a voltage level opposite to that of the carry signal of the current stage and that of a gate-on voltage.

The carry signal generation unit 213 may include a fifteenth transistor Tr15. The clock terminal CK may be connected to an input terminal of the fifteenth transistor Tr15. Thus, the clock signal CKV or the inverted clock signal CKVB may be input to the input terminal of the fifteenth transistor Tr15. A control terminal of the fifteenth transistor Tr15 may be connected to an output (i.e., the first node N1) of the input unit 211, and an output terminal of the fifteenth transistor Tr15 may be connected to the carry signal output terminal OUT2 which outputs a carry signal. A parasitic capacitor (not shown) may be formed between the control terminal and the output terminal of the fifteenth transistor Tr15. The output terminal of the fifteenth transistor Tr15 may be connected not only to the carry signal output terminal OUT2 but also to the noise elimination unit 215 and the pull-down unit 216 to receive the second gate-off voltage Vss2. As a result, when a carry signal is low, the fifteenth transistor Tr15 may have a value of the second gate-off voltage VSS2.

The output unit 214 may include a first transistor Tr1 and an output capacitor. A control terminal of the first transistor Tr1 may be connected to the first node N1, and the clock signal CKV or the inverted clock signal CKVB may be input to an input terminal of the first transistor Tr1 through the clock terminal CK. An output capacitor C may be formed between the control terminal and an output terminal of the first transistor Tr1, and the output terminal of the first transistor Tr1 may be connected to the gate output terminal OUT1. The output terminal of the first transistor Tr1 may be connected to the noise elimination unit 215 and the pull-down unit 216 and may be connected to the first power source terminal Vin1 by the noise elimination unit 215 and the pull-down unit 216. As a result, a gate-off voltage may have a value of the first gate-off voltage Vss1. The output unit 214 may output a gate voltage based on the voltage of the first node N1 and the clock signal CKV. The voltage of the first node N1 may be determined based on a voltage difference between the control terminal and the output terminal of the first transistor Tr1. The voltage difference between the control terminal and the output terminal of the first transistor Tr1 may be stored in the output capacitor, and the charged voltage in the output capacitor may be boosted up when a high voltage is applied to the output unit 214 by the clock signal CKV. Accordingly, a high voltage may be output as the gate-on voltage.

The noise elimination unit 215 may be controlled by an output of the third node N3. The noise elimination unit 215 may include a third transistor Tr3, a pair of tenth transistors, e.g., tenth and additional tenth transistors Tr10 and Tr10-1, and a pair of eleventh transistors, e.g., eleventh and additional eleventh transistors Tr11 and Tr11-1. A control terminal of the third transistor Tr3 may be connected to the third node N3, and an input terminal of the third transistor Tr3 may be connected to the gate output terminal OUT1, and an output terminal of the third transistor Tr3 may be connected to the first power source terminal Vin1. The third transistor Tr3 may change the voltage of the gate output terminal OUT1 to the first gate-off voltage Vss1 based on the voltage of the third node N3.

An input terminal of the tenth Tr10 and an output terminal of the additional tenth transistors Tr10-1 may be connected and control terminals of the tenth Tr10 and additional tenth transistors Tr10-1 are connected to the same terminals of the tenth transistor Tr10 and the additional tenth transistors Tr10-1 (hereinafter, collectively referred to as "series connected tenth transistors"). The control terminals of the tenth and additional tenth transistors Tr10 and Tr10-1 may all be connected to the third node N3, and an input terminal of the series connected tenth transistors Tr10 and Tr10-1 may be connected to the first node N1, and an output terminal of the series connected tenth transistors Tr10 and Tr10-1 may be connected to the second power source terminal Vin2. The tenth and additional tenth transistors Tr10 and Tr10-1 may change the voltage of the first node N1 to the second gate-off voltage Vss2 according to the voltage of the third node N3. The use of a series-connected tenth transistors Tr10 and Tr10-1 may enable a voltage difference between the second gate-off voltage Vss2 and the third node N3 to be shared by the series-connected tenth transistors Tr10 and Tr10-1, thereby reducing a leakage current in the first node N1. In an alternative exemplary embodiment, the noise elimination unit 215 may include three or more series-connected transistors. In such an embodiment, input and output terminals of the transistors may be connected to each other in series, and control terminals of the series-connected transistors may be connected to the same third node N3.

The eleventh transistor Tr11 may have a control terminal connected to the third node N3, an input terminal connected to the carry signal output terminal OUT2, and an output terminal connected to the second power source terminal Vin2. That is, the eleventh transistor Tr11 may change the voltage of the carry signal output terminal OUT2 to the second gate-off voltage Vss2 based on the voltage of the third node N3.

The additional eleventh transistor Tr11-1 may have a control terminal connected to a second transistor Tr2 of the pull-down unit 216 and the second input terminal R, an input terminal connected to the carry signal output terminal OUT2, and an output terminal connected to the second power source terminal Vin2. The additional eleventh transistor Tr11-1 may change the voltage of the carry signal output terminal OUT2 to the second gate-off voltage Vss2 based on a carry signal of a next stage.

The pull-down unit 216 may be controlled by the carry signal of the next stage. The pull-down unit 216 may include the second transistor Tr2, the pair of ninth transistors, e.g., the ninth transistor Tr9 and the additional ninth transistor Tr9-1, and a seventeenth transistor Tr17. The second transistor Tr2 may have a control terminal connected to the second input terminal R, an input terminal connected to the gate output terminal OUT1, and an output terminal connected to the first power source terminal Vin1. The second transistor Tr2 may change the voltage of the gate output terminal OUT1 to the first gate-off voltage Vss1 according to the carry signal of the next stage.

An input terminal of the ninth Tr9 and an output terminal of the additional ninth transistors Tr9-1 may be connected to each other and control terminals of the ninth Tr9 and additional ninth transistors Tr9-1 are connected to the same terminals of the ninth Tr9 and additional ninth transistors Tr9-1, that is, the ninth transistor Tr9 and the additional ninth transistor Tr9-1 may be a series-connected pair of transistors (hereinafter, collectively referred to as "series-connected ninth transistors"). The control terminals of the ninth and additional ninth transistors Tr9 and Tr9-1 may all be connected to the second input terminal R, and an input terminal of the series-connected ninth transistors Tr9 and Tr9-1 may be connected to the third node N3, and an output terminal of the series-connected transistors Tr9 and Tr9-1 may be connected to the second input terminal R. The use of a pair of transistors connected to each other in series may enable a voltage (e.g., a voltage at a low voltage) difference between the second gate-off voltage Vss2 and the carry signal of the next stage to be shared by the series-connected transistors, thereby reducing a leakage current in the first node N1. In an alternative exemplary embodiment, the pull-down unit 216 may include three or more ninth transistors are connected to each other in series. In such an embodiment, input and output terminals of the transistors may be connected to each other in series, and control terminals of the series connected ninth transistors may be connected to the same second input terminal R.

The seventeenth transistor Tr17 may have a control terminal connected to the second input terminal R, an input terminal connected to the carry signal output terminal OUT2, and an output terminal connected to the second power source terminal Vin2.

In an exemplary embodiment, a gate voltage and a carry signal may have various voltage values. In such an embodiment, the first gate-off voltage Vss1 and the second gate-off voltage Vss2 may have negative values.

In a stage of a gate driver 200, the carry signal generation unit 213 and the output unit 214 may be operated by the voltage of the first node N1 to output a high voltage of a carry signal and the gate-on voltage. The carry signal may be lowered from the high voltage to the second gate-off voltage Vss2 by the carry signals of the previous and next stages, and the gate-on voltage may be lowered to the first gate-off voltage Vss1 to become the gate-off voltage.

In such an embodiment described above, the eighth transistor Tr8 and the thirteenth transistor Tr13 of the inverter unit 212 may have output terminals connected to the second gate-off voltage Vss2. As a result, the third node N3 may have a value of the second gate-off voltage Vss2 as a low voltage value thereof, thereby affecting transistors of the noise elimination unit 215 which receive the voltage of the third node N3 (i.e., an output of the inverter unit 212) through control terminals thereof. Generally, a thin-film transistor using an oxide semiconductor produces a leakage current more than 10 times a leakage current produced by a thin-film transistor using amorphous silicon. In an exemplary embodiment, where the thin-film transistor includes the oxide semiconductor, the leakage current is effectively reduced.

In an exemplary embodiment, as shown in FIG. 4, each stage may include one or more pairs of series-connected thin-film transistors (i.e., a pair of transistors where input and output terminals of each of the pair of thin-film transistors are connected to each other, and control terminals of each of the pair of thin-film transistors are connected to the same terminal). Such pairs of series-connected transistors are the pair of ninth and additional ninth transistors Tr9 and Tr9-1 and the pair of tenth and additional tenth transistors Tr10 and Tr10-1. Such pairs of transistors may all operate to lower the voltage of the first node N1 to the second gate-off voltage Vss2. The ninth and additional ninth transistors Tr9 and Tr9-1 may operate based on the carry signal of the next stage, and the tenth and additional tenth transistors Tr10 and Tr10-1 may operate based on an output of the inverter unit 212 (that is, the voltage of the third node N3). In an exemplary embodiment, such pairs of series-connected transistors are provided such that the leakage current may be reduced compared with an embodiment where a single transistor is provided instead thereof, in which the leakage current is generated due to a voltage difference between a voltage applied to a control terminal of the transistor and the second gate-off voltage Vss2 even when the transistor is off. However, in an exemplary embodiment, where two transistors are connected to each other in series, the voltage difference may be shared by the two transistors. Therefore, the leakage current may be reduced through the transistors. In such an embodiment, as the voltage of a thin-film transistor using an oxide semiconductor increases, the leakage current of the thin-film transistor increases geometrically. However, when the voltage is dropped by half, the leakage current is also reduced by more than half. Thus, the leakage current may be reduced.

In an exemplary embodiment as shown in FIG. 4, glitch noise generated at the carry signal output terminal OUT2 due to a delay of the clock signal CKV may be eliminated using the seventeenth transistor Tr17 based on the carry signal of the next stage.

In such an embodiment, a transistor and a wiring for stabilizing the current stage using the signal (e.g., the carry signal) of the next stage may be omitted. In an alternative exemplary embodiment, the voltage of the first node N1 or the third node N3 of the current stage may be stabilized using a transistor. However, in an exemplary embodiment shown in FIG. 4, the wiring connection between stages has been simplified by removing such a transistor, and the size of each stage may be reduced by removing such a transistor. Accordingly, in an exemplary embodiment, the size of the gate driver 200 included in a peripheral area outside a display area of the display device 1000 may be reduced, thereby allowing the display device 1000 to have a narrow bezel.

In an exemplary embodiment as shown in FIG. 4, the output terminals of the ninth and additional ninth transistors Tr9 and Tr9-1 are connected to the second gate-off voltage Vss2, thereby improving a delay in the time required for the gate voltage to drop due to a delay in the first node N1. That is, the voltage of the first node N1 may be reduced to a lower voltage, thereby causing the gate voltage to drop fast to a low voltage. As a result, the size of a transistor (such as the second transistor Tr2) which pulls down the voltage of the gate output terminal OUT1 may be reduced. The reduced size of the transistor included in each stage reduces the size of each stage, thereby allowing a display device to have a narrow bezel.

FIG. 5 is a graph of current versus voltage of an oxide semiconductor in an exemplary embodiment of the gate driver 200 according to the invention. The horizontal axis represents a voltage difference between a gate electrode and a source electrode, and the vertical axis represents a current (leakage current) between the source electrode and a drain electrode.

A thin-film transistor using an oxide semiconductor may be degraded by the Vds voltage between the drain electrode and the source electrode and a Vgs voltage between the gate electrode and the source electrode. When a carry signal of a previous stage is input to the carry signal output terminal OUT2 of the previous stage, the Vds voltage of the fourth transistor Tr4 may instantly be increased up to about 40 V to about 50 V. Accordingly, the fourth transistor Tr4 may be degraded, thereby lowering a voltage level of a start signal and ultimately affecting the gate-on voltage. That is, a high Vds voltage may undermine the reliability of the gate driver 200.

Referring to FIG. 5, a graph represented by a dash-dot line indicates a leakage current in an input unit of a stage without a storage capacitor, and a graph represented by a solid line indicates a leakage current in an exemplary embodiment, where the storage capacitor C is included in the input unit 211 as shown in FIG. 4. In an exemplary embodiment of the gate driver 200 as shown in FIG. 4, the Vds voltage of the fourth transistor Tr4 is lowered, and the Vgs voltage is thereby lowered. Consequently, in such an embodiment, the leakage current may be reduced.

Figure 8:
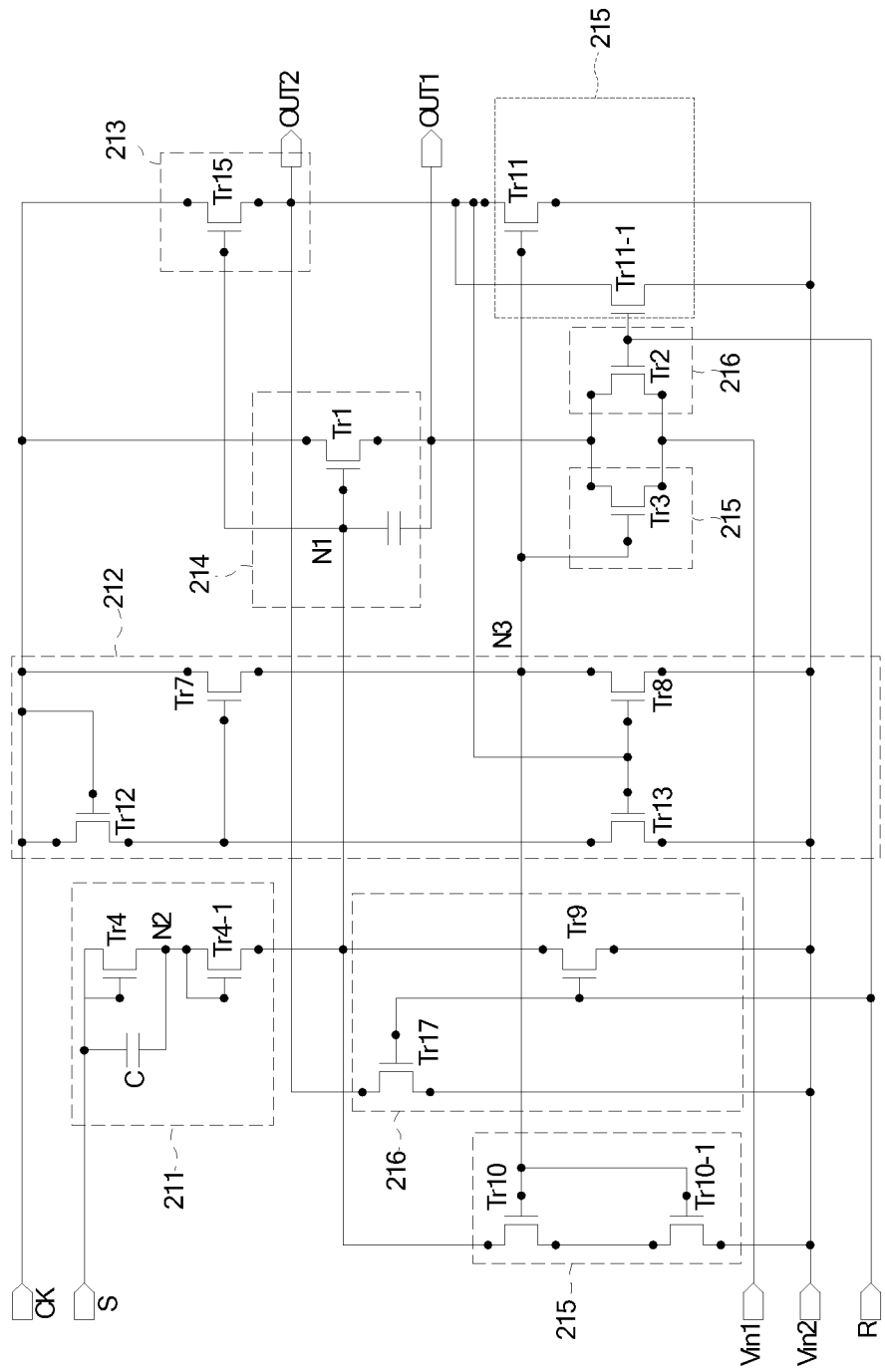
FIGS. 8 through 10 are circuit diagrams of alternative exemplary embodiments of a stage of a gate driver according to the invention.
Figure 9:
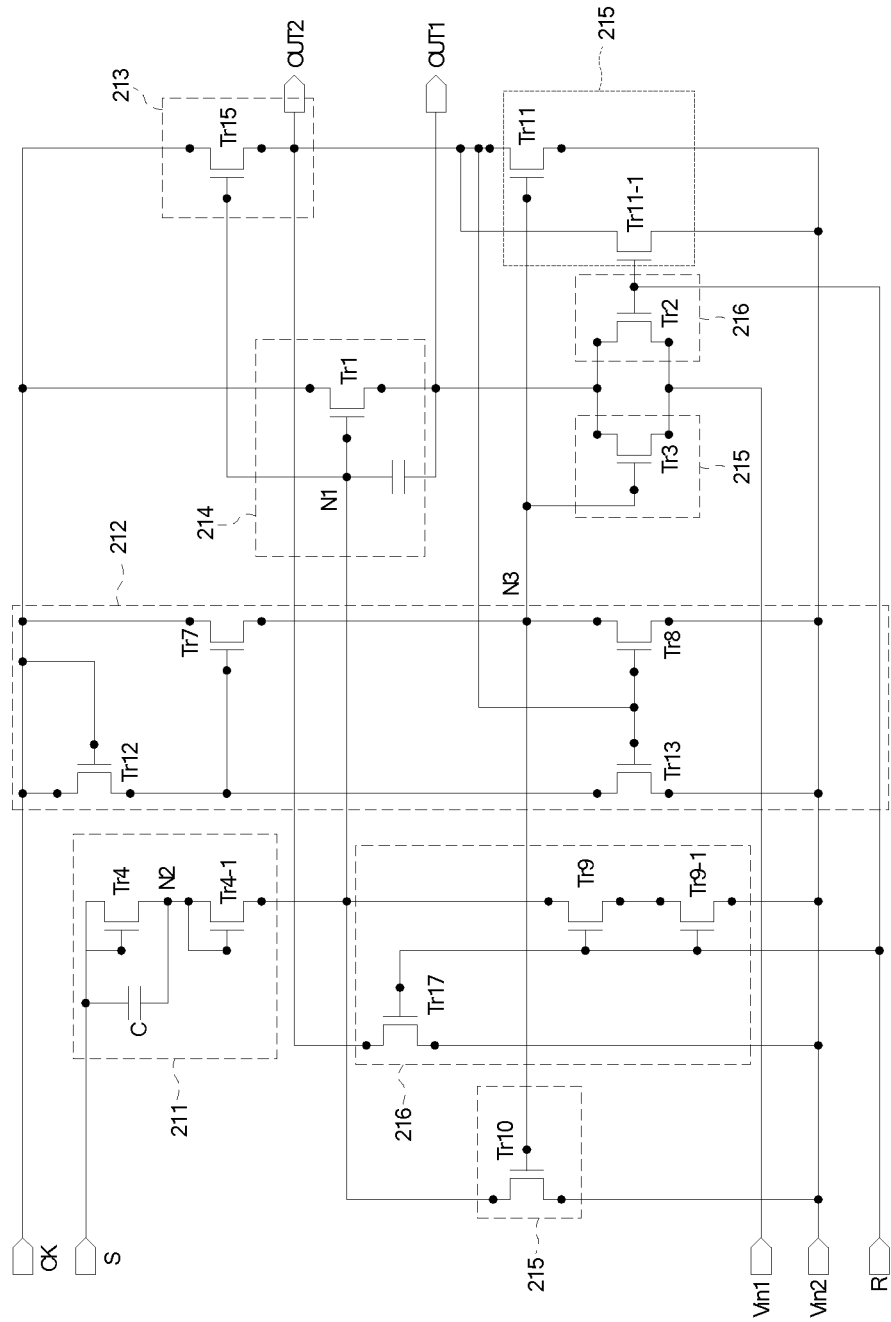
Figure 10:
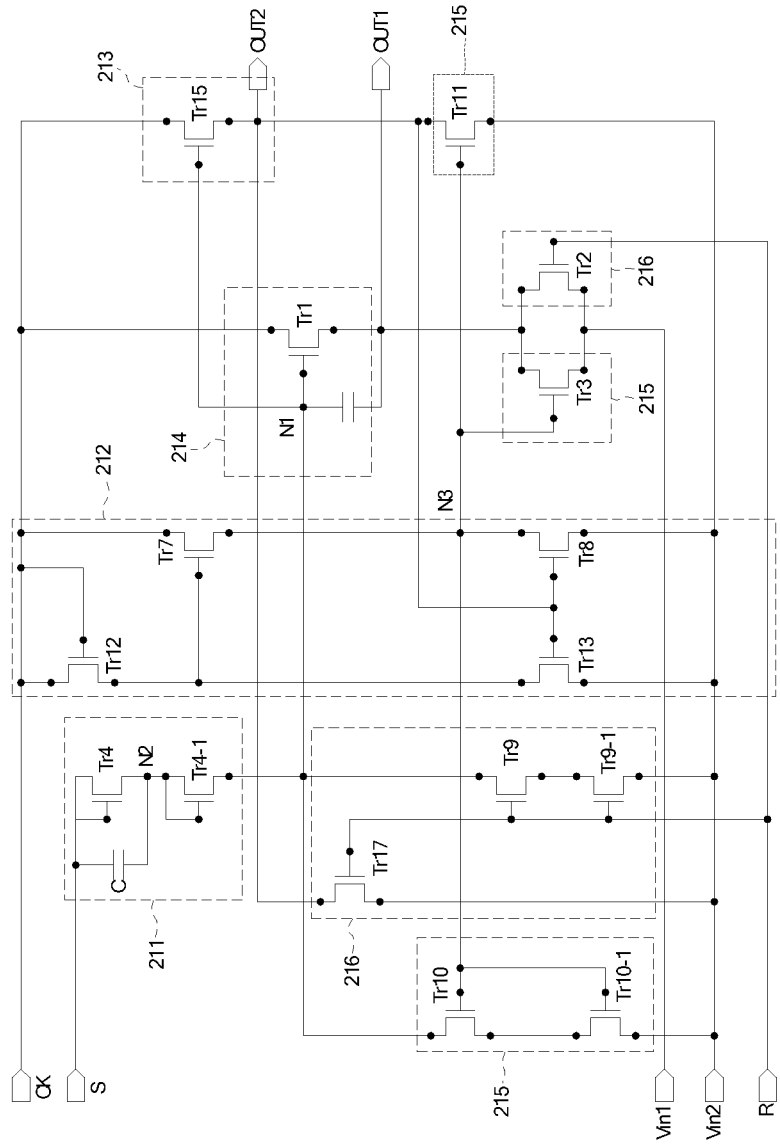

FIG. 8 through FIG. 10 are circuit diagrams of alternative exemplary embodiments of a stage of a gate driver according to the invention. In an alternative exemplary embodiment, as shown in FIG. 8, the additional ninth transistor Tr9-1 may be omitted. In such an embodiment, the pull-down unit 216 may include a single ninth transistor Tr9 instead of a pair of series-connected ninth transistors shown in FIG. 4, where a pair of ninth transistors Tr9 and Tr9-1 are used to reduce the leakage current. In such an embodiment, a single large-sized thin-film transistor having increased width and length of a channel may be used.

In another alternative exemplary embodiment, as shown in FIG. 9, an additional tenth transistor Tr10-1 may be omitted. In such an embodiment, the noise elimination unit 215 may include a single tenth transistor Tr10 instead of the pair of series-connected tenth transistors Tr10 and Tr10-1 shown in FIG. 4 that are used to reduce the leakage current. In such an embodiment, a single large-sized thin-film transistor having increased width and length of a channel may be used.

In such an embodiment, the additional ninth transistor Tr9-1 may be omitted as described above with reference to FIG. 8.

The circuit diagram shown in FIG. 10 is substantially the same as the circuit diagram shown in FIG. 4 except for the additional eleventh transistor Tr11-1. In an alternative exemplary embodiment, as shown in FIG. 10, the additional eleventh transistor Tr11-1 may be omitted.

The additional eleventh transistor Tr11-1 changes a voltage of a carry signal output terminal OUT2 to a second gate-off voltage Vss2 based on a carry signal of a next stage. In an exemplary embodiment shown in FIG. 4, the additional eleventh transistor Tr11-1 reduces a gate voltage to a low voltage in response to the carry signal of the next stage generated by an inverted clock signal CKVB. However, in an exemplary embodiment shown in FIG. 10, the additional eleventh transistor Tr11-1 may be omitted, and the eleventh and seventeenth transistors Tr11 and Tr17 may reduce the voltage of the carry signal output terminal OUT2 to the second gate-off voltage Vss2.

As described above with reference to FIG. 8 or 9, in such an embodiment shown in FIG. 10, the additional ninth transistor Tr9-1 or the additional tenth transistor Tr10-1 may be omitted.

Figure 11:
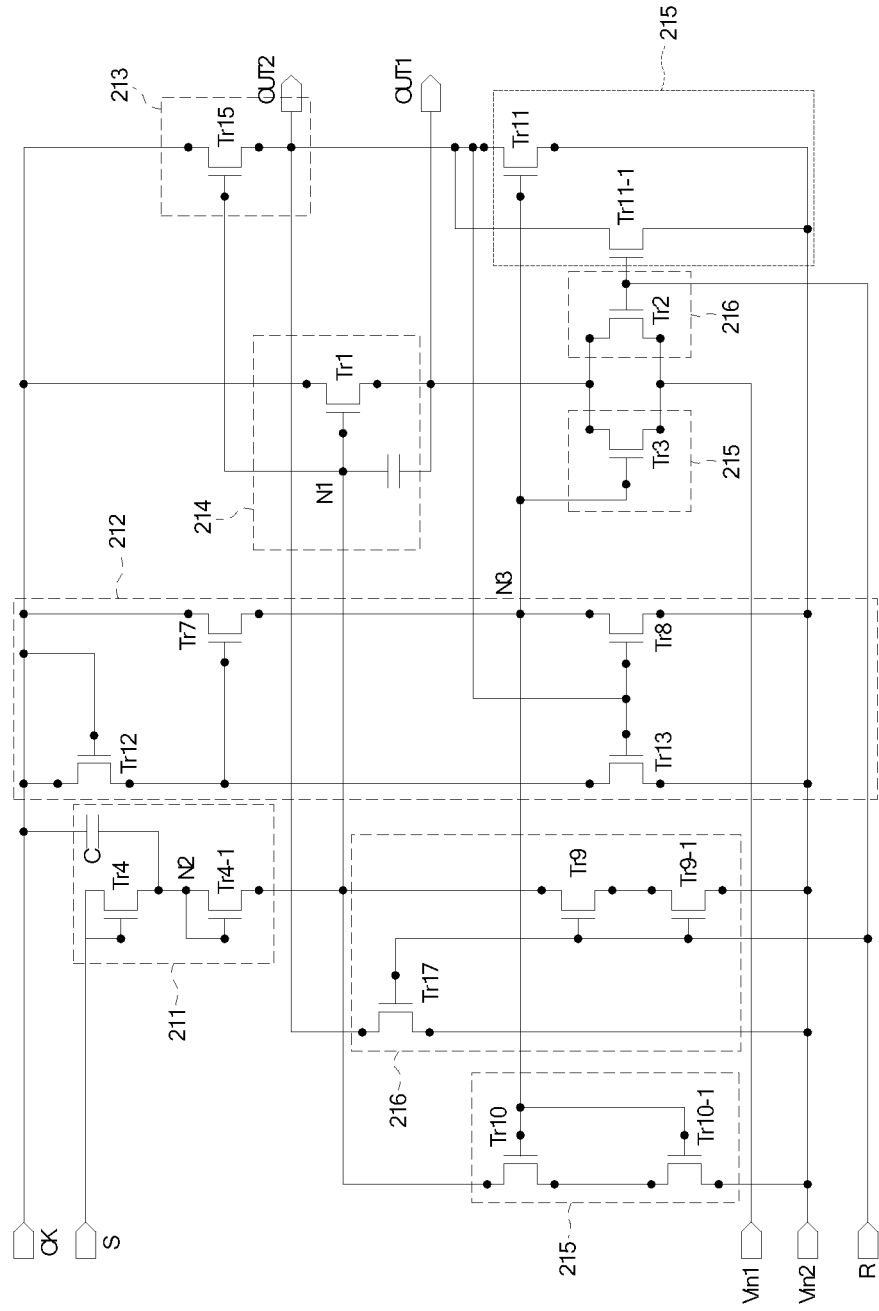
FIG. 11 is a circuit diagram of an alternative exemplary embodiment of a stage of a gate driver according to the invention.
Figure 12:
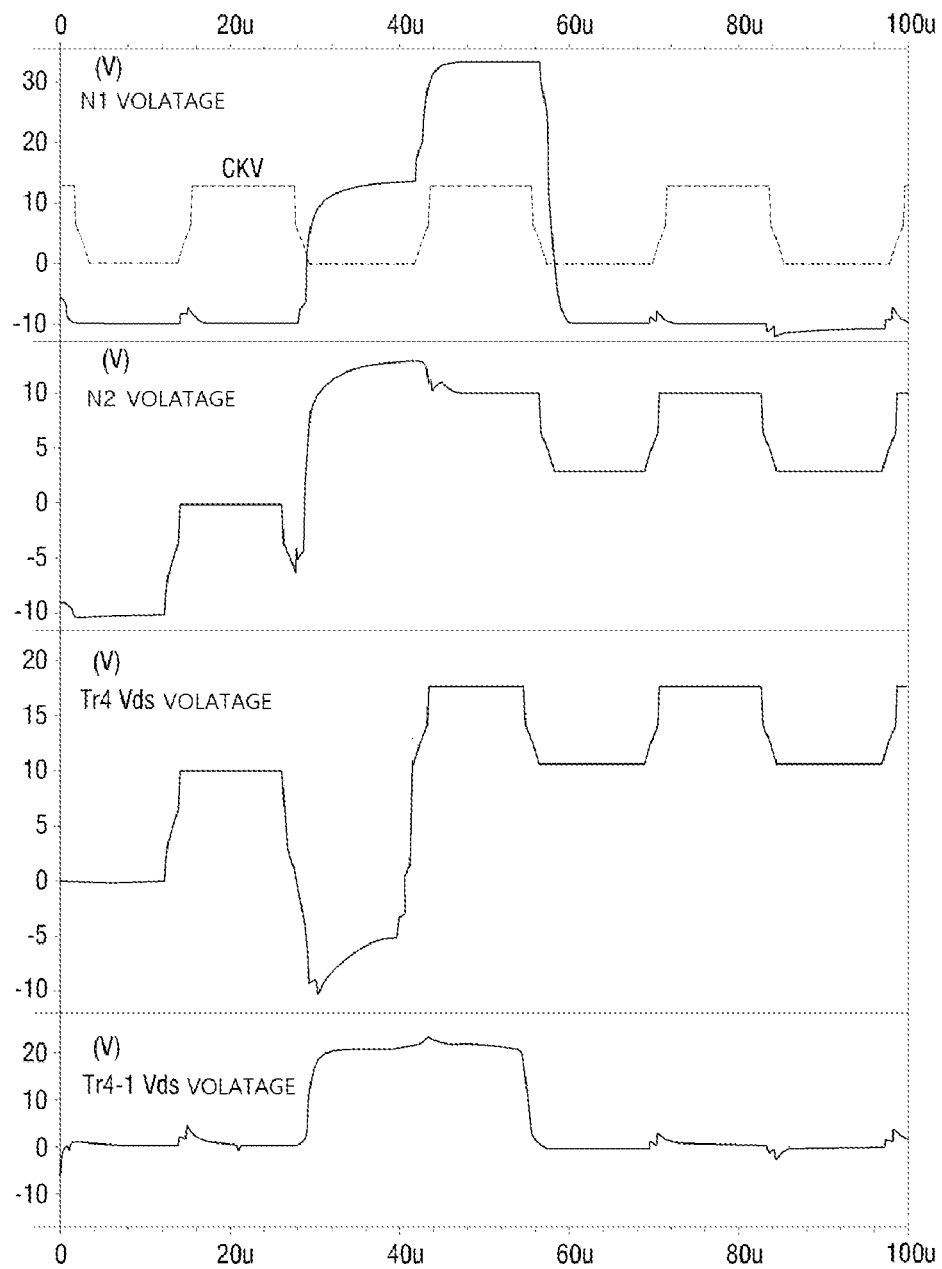
FIG. 12 is a timing diagram illustrating the variation in voltage level of the circuit of FIG. 11.

FIG. 11 is a circuit diagram of an alternative exemplary embodiment of a stage of a gate driver 200 according the invention. FIG. 12 is a timing diagram illustrating the variation in voltage level of a circuit in the stage of FIG. 11.

The circuit diagram in FIG. 11 is substantially the same as the circuit diagram shown in FIG. 4 except for an input part 211. The same or like elements shown in FIG. 7 have been labeled with the same reference characters as used above to describe the exemplary embodiments of the stage shown in FIG. 4, and any repetitive detailed description thereof will hereinafter be omitted or simplified.

Referring to FIG. 11, in an exemplary embodiment, each stage of the gate driver 200 may include an input unit 211, an inverter unit 212, a carry signal generation unit 213, an output unit 214, a noise elimination unit 215, and a pull-down unit 216.

The input unit 211 may connect a first input terminal S and a first node N1 and may include a pair of fourth transistors, e.g., a fourth transistor Tr4 and an additional fourth transistor Tr4-1. An output terminal of the fourth transistor Tr4 and an input terminal of the additional fourth transistor Tr4-1 may be connected by a second node N2, and the input unit 211 may include a storage capacitor C which connects a clock terminal CK and the second node N2. An input terminal of the fourth transistor Tr4 may be connected to the first input terminal S, and an output terminal of the additional fourth transistor Tr4-1 may be connected to the first node N1. A control terminal of the fourth transistor Tr4 and a control terminal of the additional fourth transistor Tr4-1 may be commonly connected (diode-connected) to the input terminal of the fourth transistor Tr4 and the input terminal of the additional fourth transistor Tr4-1.

When receiving a high voltage from the clock terminal CK, the input unit 211 may deliver the high voltage to the first node N1. Since the fourth transistor Tr4 and the additional fourth transistor Tr4-1 are connected to each other in series, a voltage (hereinafter, referred to as an "input unit voltage") difference between the first input terminal S and the first node N1 may be shared by the fourth transistor Tr4 and the additional fourth transistor Tr4-1. Therefore, a leakage current at the second node N2 may be reduced.

The storage capacitor C of the input unit 211 may maintain a voltage of the second node N2 for a certain period of time. When the additional fourth transistor Tr4-1 is additionally provided in the input unit 211 along with the fourth transistor Tr4, voltages applied to the fourth transistor Tr4 and the additional fourth transistor Tr4-1 may be different from each other, and the improvement of the display quality may be thereby limited. In an exemplary embodiment, the storage capacitor C which connects the clock terminal CK and the second node N2 is additionally installed in the input unit 211 to allow the fourth transistor Tr4 and the additional fourth transistor Tr4-1 share stress applied thereto. The variation in the level of a voltage applied to each of the first node N1, the second node N2, the fourth transistor Tr4 and the additional fourth transistor Tr4-1 will now be described in detail with reference to FIG. 12.

FIG. 12 is a timing diagram illustrating the variation in voltage level of a circuit of an exemplary embodiment of a stage, in which the storage capacitor C is connected to the clock terminal CK and the second node N2. A first graph of FIG. 12 illustrates the variation in voltage level of the first node N1, a second graph illustrates the variation in voltage level of the second node N2, a third graph illustrates the level of a Vds voltage of the fourth transistor Tr4, and a fourth graph illustrates the level of a Vds voltage of the additional fourth transistor Tr4-1.

Referring to the first graph of FIG. 12, the fourth and additional fourth transistors Tr4 and Tr4-1 may be turned on by a carry signal of a previous stage and apply a voltage of the carry signal of the previous stage to the first node N1. Since the first node N1 is connected to an output capacitor, the output capacitor may store the voltage of the carry signal of the previous stage. Then, the fifteenth transistor Tr15 may deliver a voltage of a clock signal CKV to the first node N1 in response to the clock signal CKV. Thus, a boosted-up voltage may be applied to the first node N1. Next, the ninth and additional ninth transistors Tr9 and Tr9-1 may be turned on by a carry signal of a next stage and apply the second gate-off voltage Vss2 to the first node N1. Thus, the first node N1 may have a negative voltage. In an exemplary embodiment, the clock signal CKV may be transmitted at regular intervals.

Referring to the second graph of FIG. 12, the fourth transistor Tr4 may apply a voltage corresponding to the carry signal of the previous stage to the second node N2 in response to the carry signal of the previous stage. The storage capacitor C connected to the clock terminal CK may maintain the voltage of the second node N2 constant during a period in which the first node N1 is boosted up.

Referring to FIG. 12, the third graph illustrates the Vds voltage of the fourth transistor Tr4. Since the storage capacitor C connected to the clock terminal CK maintains the voltage of the second node N2 substantially constant during a period in which the first node N1 is boosted up, a maximum of less than about 20 V may be applied to the fourth transistor Tr4.

Referring to the fourth graph of FIG. 12, the Vds voltage of the additional fourth transistor Tr4-1 is illustrated. As shown in FIG. 12, a voltage as large as a voltage applied to the fourth transistor Tr4 based on a voltage difference between the first input terminal S and the first node N1 may be applied to the additional fourth transistor Tr4-1. Thus, a voltage of approximately 20 V may be applied to the additional fourth transistor Tr4-1.

That is, since the fourth transistor Tr4 and the additional fourth transistor Tr4-1 may share a voltage between the first node N1 and the first input terminal S, each of the fourth transistor Tr4 and the additional fourth transistor Tr4-1 may operate in a safety region. As a result, the degradation of the fourth transistor Tr4 and the additional fourth transistor Tr4-1 may be effectively prevented.

Since the operating principles of the inverter unit 212, the carry signal generation unit 213, the output unit 214, the noise elimination unit 215 and the pull-down unit 216 have been described above in detail with reference to FIG. 4, any repetitive detailed description thereof will be omitted.

FIGS. 13 through 20 are circuit diagrams of alternative exemplary embodiments of a stage of a gate driver according to the invention.

Figure 13:
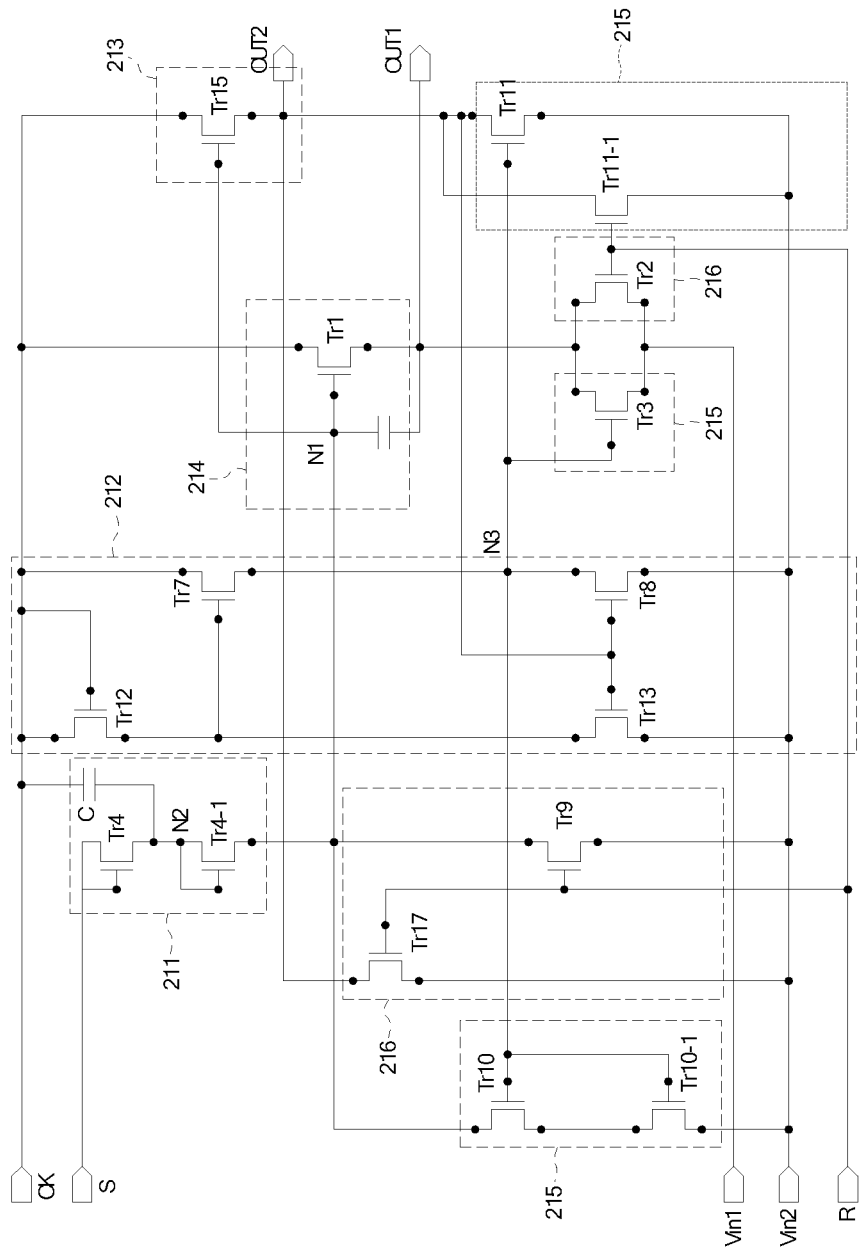
FIGS. 13 through 20 are circuit diagrams of alternative exemplary embodiments of a stage of a gate driver according to the invention.

In an alternative exemplary embodiment, as show in FIG. 13, the additional ninth transistor Tr9-1 may be omitted. In such an embodiment, the pull-down unit 216 may include a single ninth transistor Tr9 instead of the pair of series-connected ninth transistors in the exemplary embodiment of FIG. 11, where a pair of ninth transistors Tr9 and Tr9-1 is used to reduce the leakage current. In such an embodiment, a single large-sized thin-film transistor having increased width and length of a channel may be used.

Figure 14:
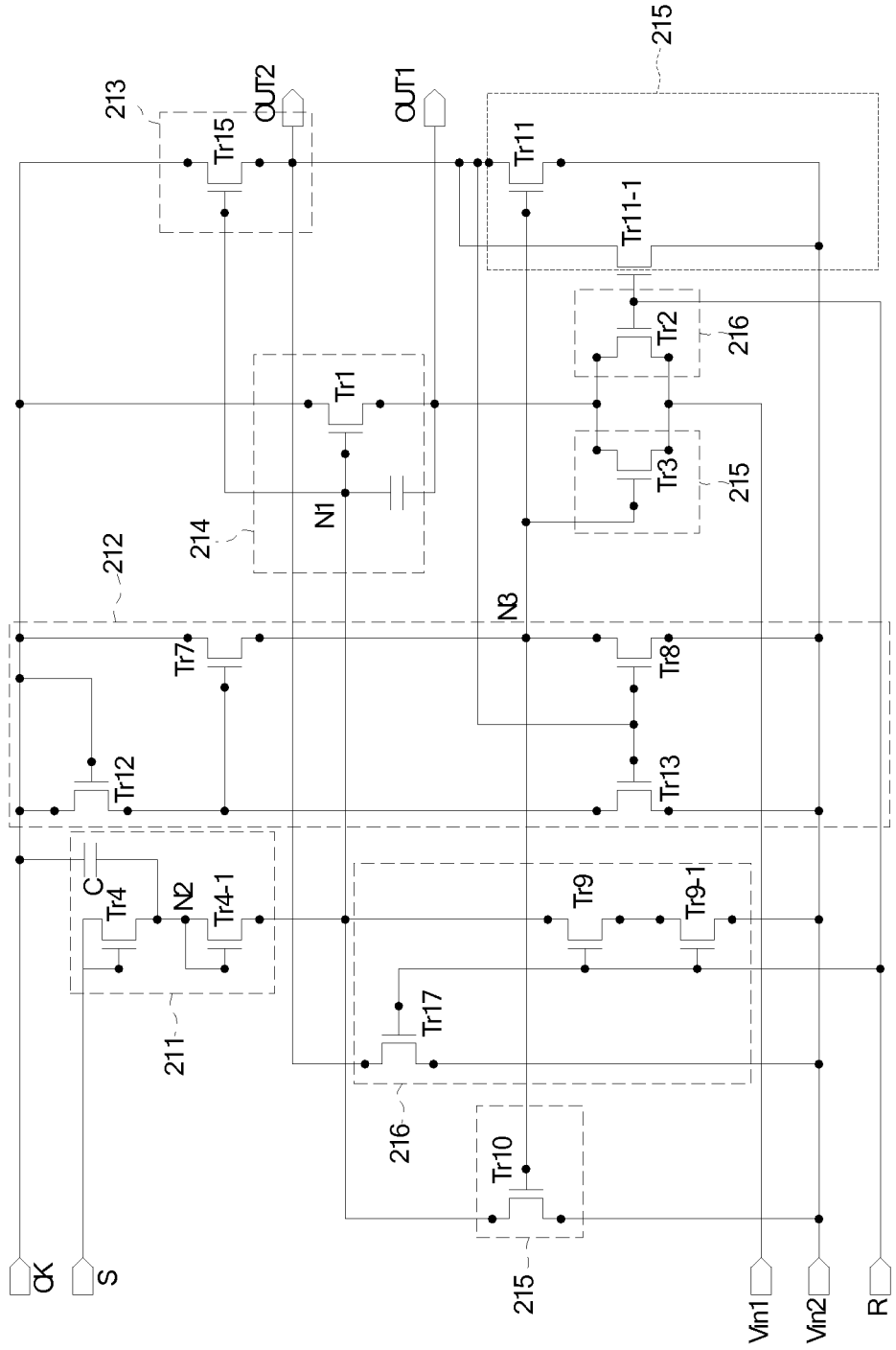

In another alternative exemplary embodiment, as shown in FIG. 14, the additional tenth transistor Tr10-1 may be omitted. In such an embodiment, the noise elimination unit 215 may include a single tenth transistor Tr10 instead of the pair of tenth transistors Tr10 and Tr10-1 used to reduce the leakage current. In such an embodiment, a single large-sized thin-film transistor having increased width and length of a channel may be use.

In such an embodiment, the additional ninth transistor Tr9-1 may be omitted as shown in FIG. 13.

Figure 15:
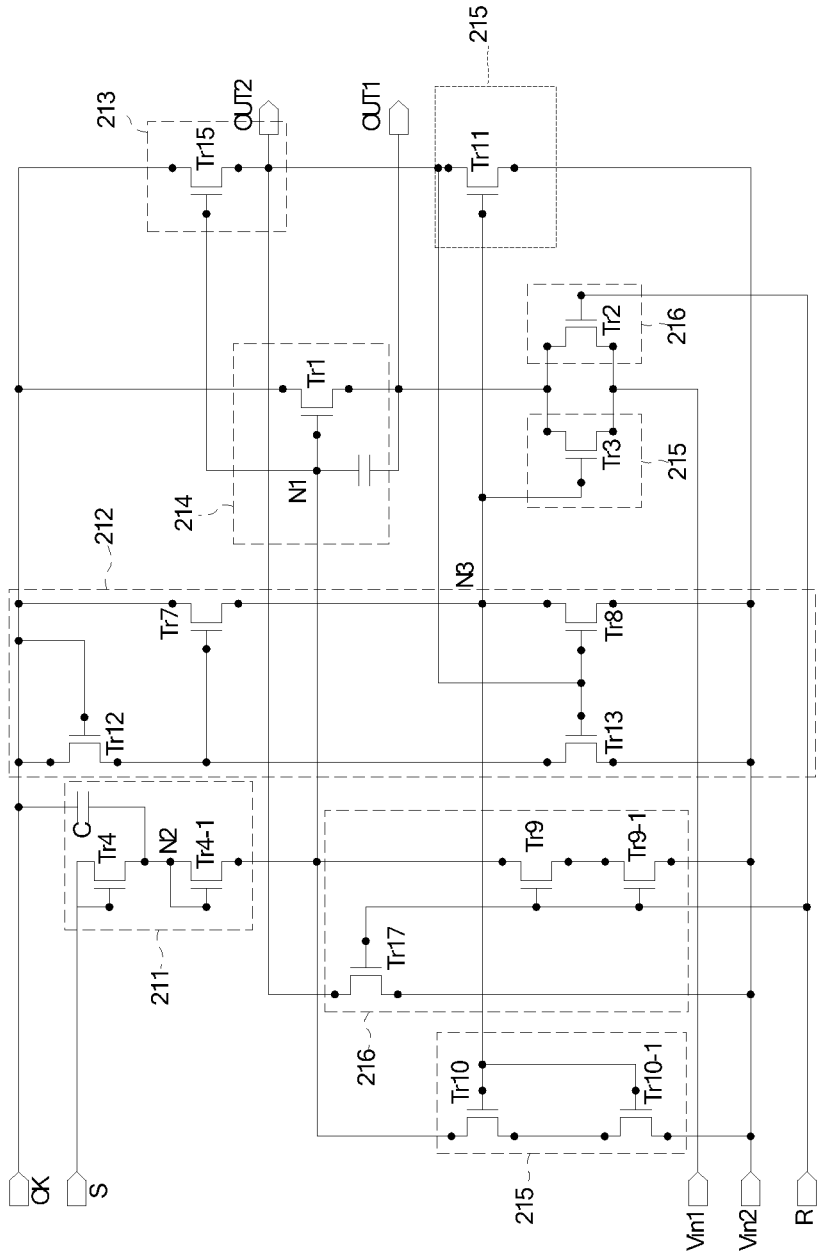

The circuit diagram shown in FIG. 15 is substantially the same as the circuit diagram shown in FIG. 11 except for the additional eleventh transistor Tr11-1. In an alternative exemplary embodiment, as shown in FIG. 10, the additional eleventh transistor Tr11-1 may be omitted.

The additional eleventh transistor Tr11-1 changes a voltage of a carry signal output terminal OUT2 to a second gate-off voltage Vss2 based on a carry signal of a next stage. In an exemplary embodiment, the additional eleventh transistor Tr11-1 reduces a gate voltage to a low voltage in response to the carry signal of the next stage generated by an inverted clock signal CKVB. However, in an exemplary embodiment shown in FIG. 15, the additional eleventh transistor Tr11-1 may be omitted, and the eleventh and seventeenth transistors Tr11 and Tr17 may reduce the voltage of the carry signal output terminal OUT2 to the second gate-off voltage Vss2.

In another alternative exemplary embodiment, the additional ninth transistor Tr9-1 or the additional tenth transistor Tr10-1 may be omitted from the exemplary embodiment shown in FIG. 15.

Figure 16:
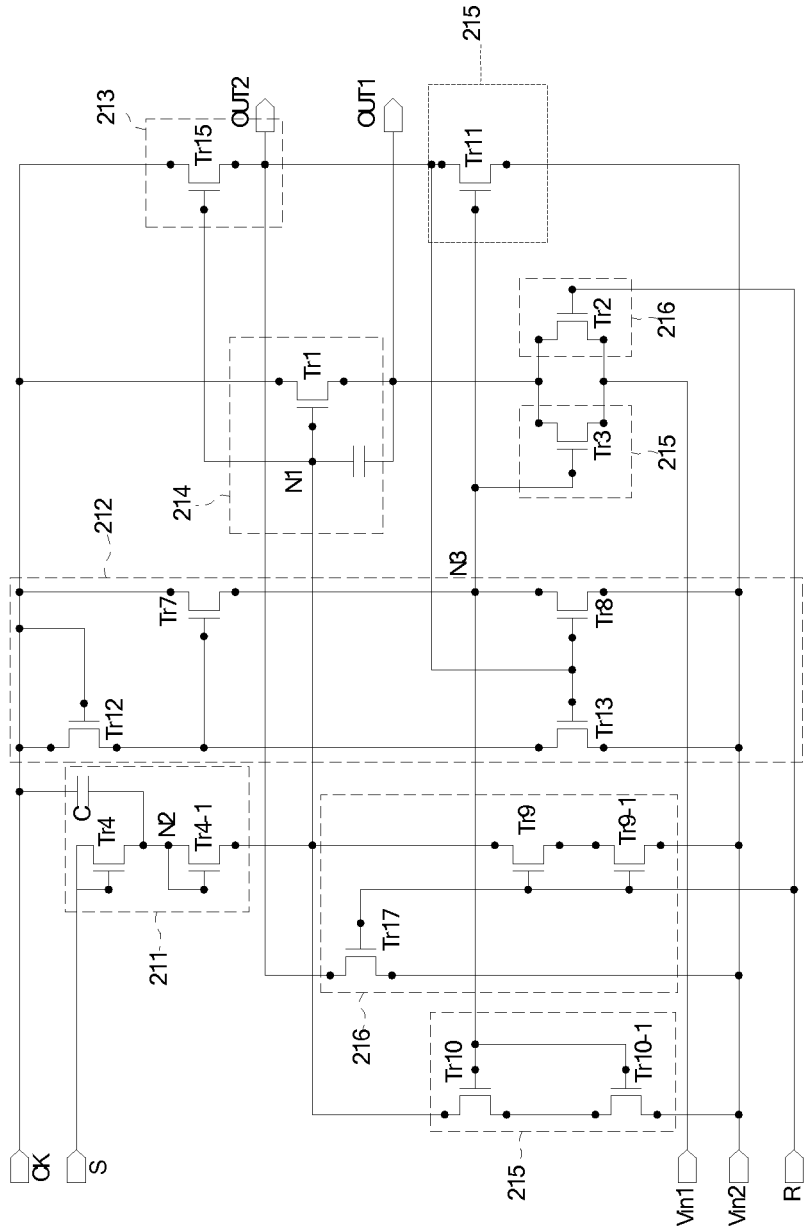

The circuit diagram shown in FIG. 16 is substantially the same as the circuit diagram shown in FIG. 2 except that a storage capacitor C is connected between a second node N2 and a first power source terminal Vin1.

Referring to FIG. 16, in an alternative exemplary embodiment of the gate driver 200, the input unit 211 of the stage may connect a first input terminal S and a first node N1 and include a fourth transistor Tr4 and an additional fourth transistor Tr4-1. An output terminal of the fourth transistor Tr4 and an input terminal of the additional fourth transistor Tr4-1 may be connected by a second node N2, and the input unit 211 may include the storage capacitor C which connects a first power source terminal Vin1 and the second node N2. An input terminal of the fourth transistor Tr4 may be connected to the first input terminal S, and an output terminal of the additional fourth transistor Tr4-1 may be connected to the first node N1. A control terminal of the fourth transistor Tr4 and a control terminal of the additional fourth transistor Tr4-1 may be commonly connected (e.g., diode-connected) to the input terminal of the fourth transistor Tr4 and the input terminal of the additional fourth transistor Tr4-1.

The first power source terminal Vin1 may provide a constant voltage, and the storage capacitor C connected to the first power source terminal Vin1 may maintain the voltage of the second node N2 substantially constant during a period in which the first node N1 is boosted up. In such an embodiment, the fourth transistor Tr4 and the additional fourth transistor Tr4-1 are connected to each other in series, such that the fourth transistor Tr4 and the additional fourth transistor Tr4-1 may substantially equally share a voltage between the first input terminal S and the first node N1, thereby reducing the leakage current at the second node N2.

Figure 17:
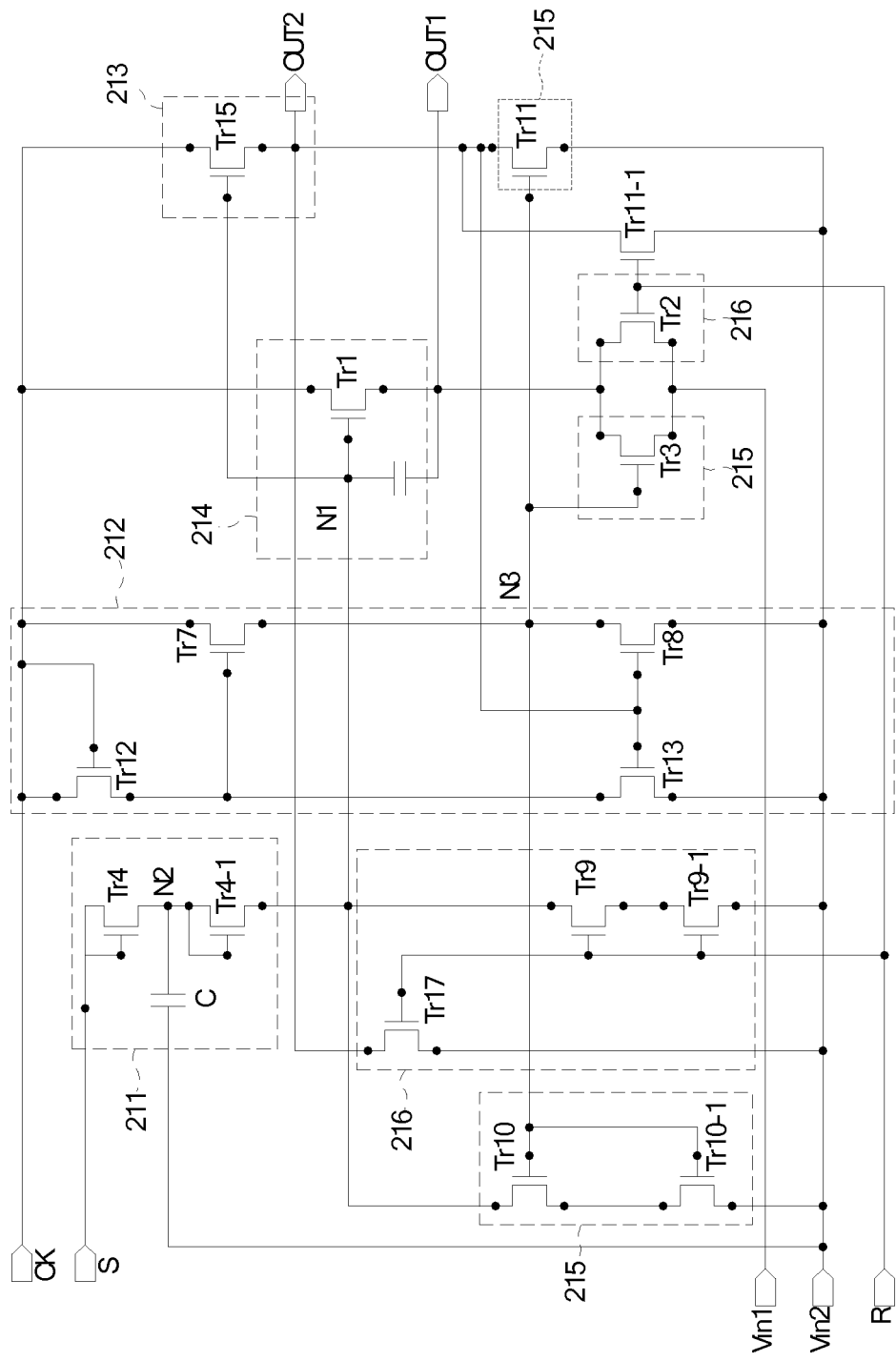

The circuit diagram shown in FIG. 17 is substantially the same as the circuit diagram shown in FIG. 11 except that a storage capacitor C is connected between a second node N2 and a second power source terminal Vin2.

Referring to FIG. 17, in an alternative exemplary embodiment of the gate driver 200, the input unit 211 of the stage may connect a first input terminal S and a first node N1 and include a fourth transistor Tr4 and an additional fourth transistor Tr4-1. An output terminal of the fourth transistor Tr4 and an input terminal of the additional fourth transistor Tr4-1 may be connected by a second node N2, and the input unit 211 may include the storage capacitor C which connects a second power source terminal Vin2 and the second node N2. An input terminal of the fourth transistor Tr4 may be connected to the first input terminal S, and an output terminal of the additional fourth transistor Tr4-1 may be connected to the first node N1. A control terminal of the fourth transistor Tr4 and a control terminal of the additional fourth transistor Tr4-1 may be commonly connected (e.g., diode-connected) to the input terminal of the fourth transistor Tr4 and the input terminal of the additional fourth transistor Tr4-1.

The second power source terminal Vin2 may provide a constant voltage, and the storage capacitor C connected to the second power source terminal Vin2 may maintain the voltage of the second node N2 substantially constant during a period in which the first node N1 is boosted up. In such an embodiment, the fourth transistor Tr4 and the additional fourth transistor Tr4-1 are connected to each other in series, such that, the fourth transistor Tr4 and the additional fourth transistor Tr4-1 may substantially equally share a voltage between the first input terminal S and the first node N1, thereby reducing the leakage current at the second node N2.

The circuit diagram shown in FIG. 118 is substantially the same as the circuit diagram shown in FIG. 11 except that a storage capacitor C is connected between a second node N2 and a second input terminal R.

Figure 18:
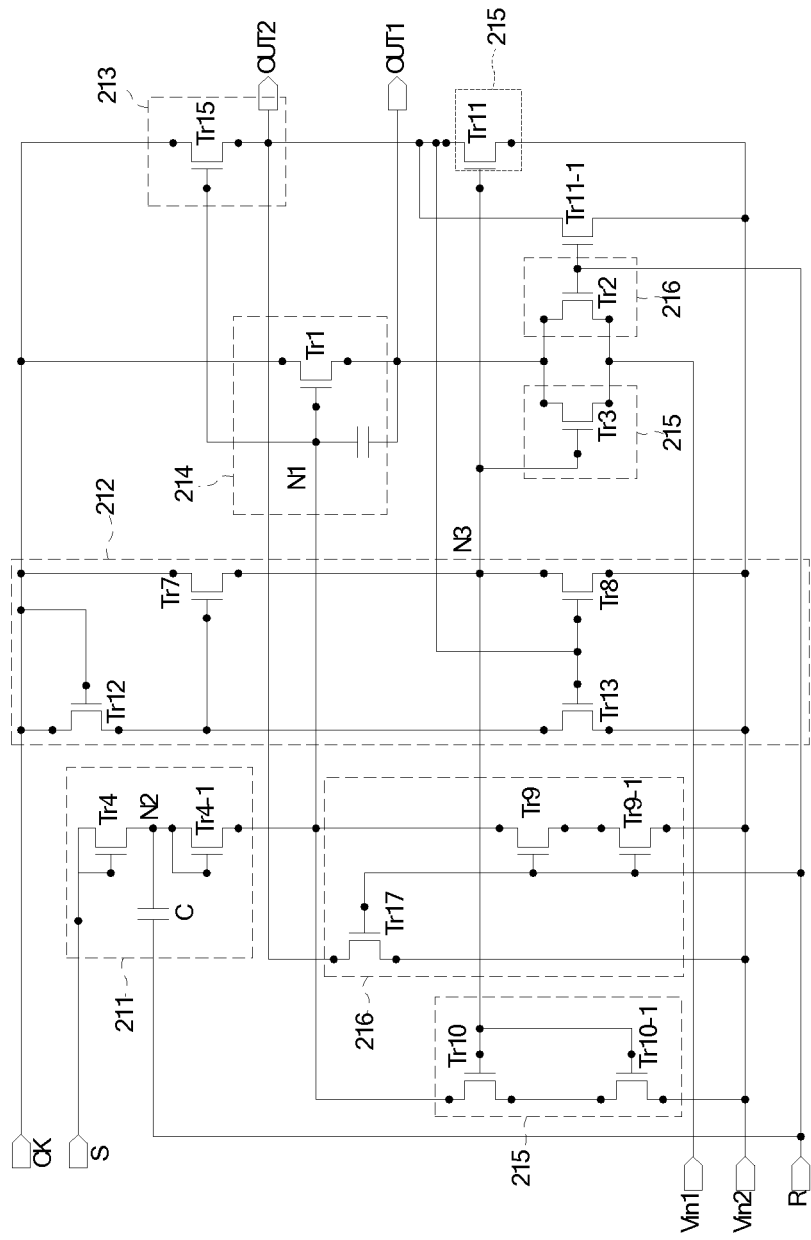

Referring to FIG. 18, in another alternative exemplary embodiment of the gate driver 200, the input unit 211 of a stage may connect a first input terminal S and a first node N1 and include a fourth transistor Tr4 and an additional fourth transistor Tr4-1. An output terminal of the fourth transistor Tr4 and an input terminal of the additional fourth transistor Tr4-1 may be connected by a second node N2, and the input unit 211 may include the storage capacitor C which connects a second input terminal R and the second node N2. An input terminal of the fourth transistor Tr4 may be connected to the first input terminal S, and an output terminal of the additional fourth transistor Tr4-1 may be connected to the first node N1. A control terminal of the fourth transistor Tr4 and a control terminal of the additional fourth transistor Tr4-1 may be commonly connected (e.g., diode-connected) to the input terminal of the fourth transistor Tr4 and the input terminal of the additional fourth transistor Tr4-1.

The second input terminal R may provide a constant voltage during a period in which the first node N1 is boosted up, and the storage capacitor C connected to the second input terminal R may maintain the voltage of the second node N2 substantially constant during the period in which the first node N1 is boosted up. In such an embodiment, the fourth transistor Tr4 and the additional fourth transistor Tr4-1 are connected to each other in series, such that the fourth transistor Tr4 and the additional fourth transistor Tr4-1 may substantially equally share a voltage between the first input terminal S and the first node N1, thereby reducing the leakage current at the second node N2.

Figure 19:
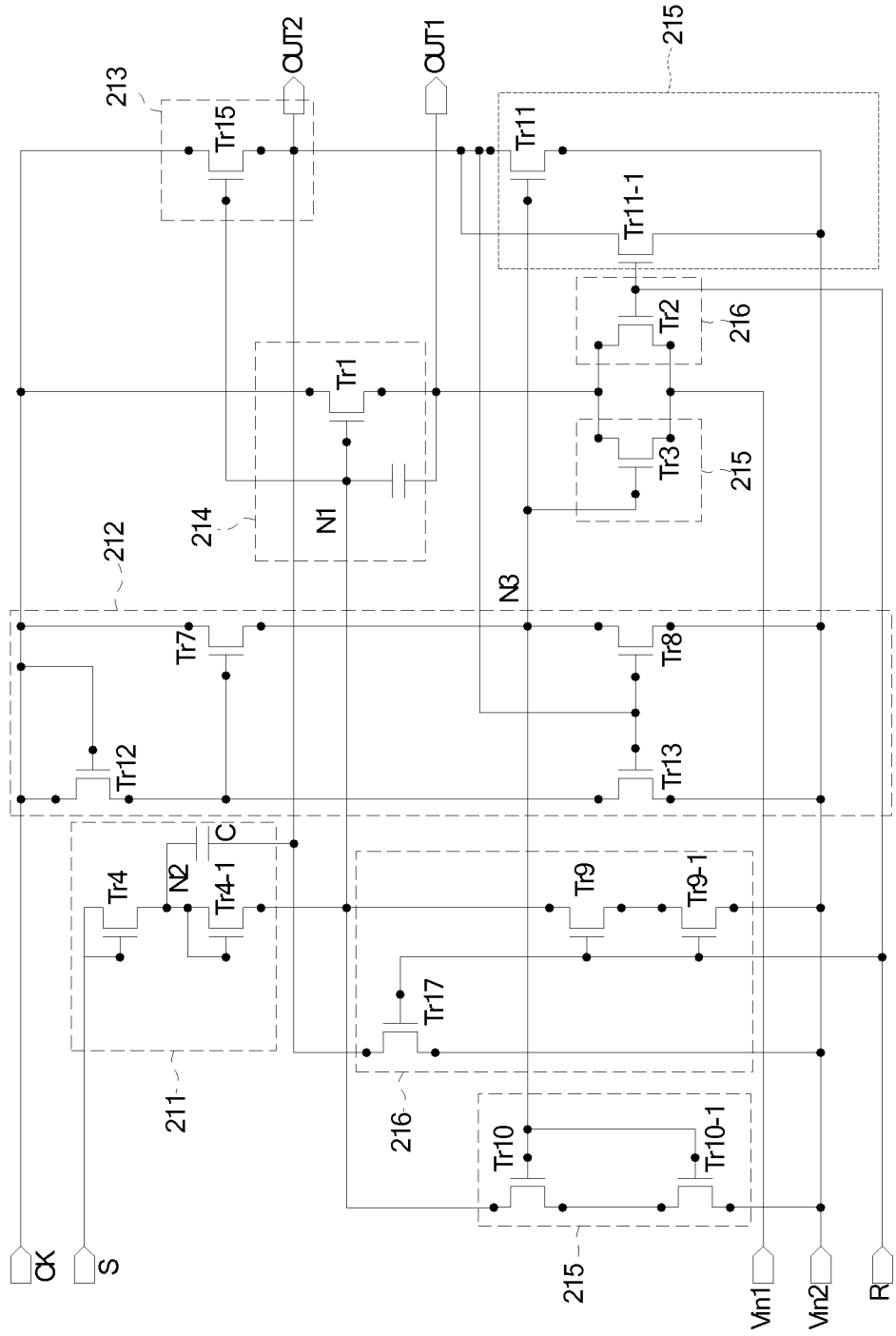

The circuit diagram shown in FIG. 19 is substantially the same as the circuit diagram shown in FIG. 11 except that a storage capacitor C is connected between a second node N2 and a carry signal output terminal OUT2.

Referring to FIG. 19, in another alternative exemplary embodiment of the gate driver 200, the input unit 211 of the stage may connect a first input terminal S and a first node N1 and include a fourth transistor Tr4 and an additional fourth transistor Tr4-1. An output terminal of the fourth transistor Tr4 and an input terminal of the additional fourth transistor Tr4-1 may be connected by a second node N2, and the input unit 211 may include the storage capacitor C which connects a carry signal output terminal OUT2 and the second node N2. An input terminal of the fourth transistor Tr4 may be connected to the first input terminal S, and an output terminal of the additional fourth transistor Tr4-1 may be connected to the first node N1. A control terminal of the fourth transistor Tr4 and a control terminal of the additional fourth transistor Tr4-1 may be commonly connected (e.g., diode-connected) to the input terminal of the fourth transistor Tr4 and the input terminal of the additional fourth transistor Tr4-1.

The carry signal output terminal OUT2 may provide a constant voltage during a period in which the first node N1 is boosted up, and the storage capacitor C connected to the carry signal output terminal OUT2 may maintain the voltage of the second node N2 substantially constant during the period in which the first node N1 is boosted up. In such an embodiment, the fourth transistor Tr4 and the additional fourth transistor Tr4-1 are connected to each other in series, such that the fourth transistor Tr4 and the additional fourth transistor Tr4-1 may substantially equally share a voltage between the first input terminal S and the first node N1, thereby reducing the leakage current at the second node N2.

Figure 20:
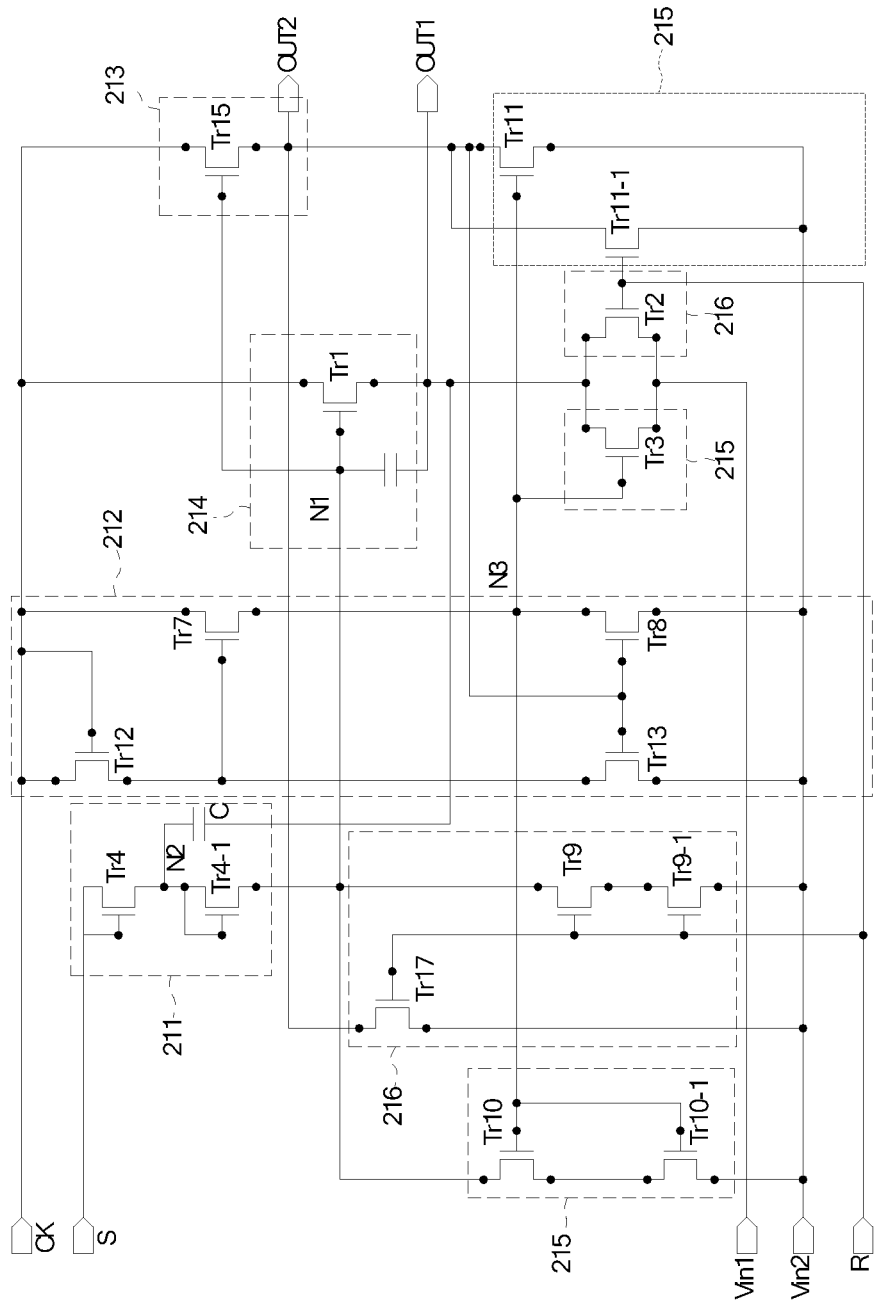

The circuit diagram shown in FIG. 20 is substantially the same as the circuit diagram shown in FIG. 11 except that a storage capacitor C is connected between a second node N2 and a gate output terminal OUT1.

Referring to FIG. 20, in another alternative exemplary embodiment of the gate driver 200, the input unit 211 of the stage may connect the first input terminal S and the first node N1 and include the fourth transistor Tr4 and the additional fourth transistor Tr4-1. An output terminal of the fourth transistor Tr4 and an input terminal of the additional fourth transistor Tr4-1 may be connected by a second node N2, and the input unit 211 may include the storage capacitor C which connects the gate output terminal OUT1 and the second node N2. An input terminal of the fourth transistor Tr4 may be connected to the first input terminal S, and an output terminal of the additional fourth transistor Tr4-1 may be connected to the first node N1. A control terminal of the fourth transistor Tr4 and a control terminal of the additional fourth transistor Tr4-1 may be commonly connected (e.g., diode-connected) to the input terminal of the fourth transistor Tr4 and the input terminal of the additional fourth transistor Tr4-1.

The gate output terminal OUT1 may provide a constant voltage during a period in which the first node N1 is boosted up, and the storage capacitor C connected to the gate output terminal OUT1 may maintain the voltage of the second node N2 substantially constantly during the period in which the first node N1 is boosted up. In such an embodiment, the fourth transistor Tr4 and the additional fourth transistor Tr4-1 are connected to each other in series, such that the fourth transistor Tr4 and the additional fourth transistor Tr4-1 may substantially equally share a voltage between the first input terminal S and the first node N1, thereby reducing the leakage current at the second node N2.

In exemplary embodiment, as described herein, a terminal which provides a constant voltage during the period in which the first node N1 is boosted up is connected to the storage capacitor C, and the storage capacitor C connected to the terminal may maintain the voltage of the second node N2 substantially constant during the period in which the first node N1 is boosted up. Therefore, the fourth transistor Tr4 and the additional fourth transistor Tr4-1 may substantially equally share a voltage between the first input terminal S and the first node N1, thereby reducing the leakage current at the second node N2.

Accordingly, in such embodiments, reliability of a gate driver in a liquid crystal display ("LCD") may be substantially improved.

In such embodiments, power consumption of the gate driver may be substantially reduced.

While the invention has been particularly shown and described with reference to exemplary embodiments thereof, it will be understood by those of ordinary skill in the art that various changes in form and details may be made therein without departing from the spirit and scope of the invention as defined by the following claims. It is therefore desired that the embodiments described herein be considered in all respects as illustrative and not restrictive, reference being made to the appended claims rather than the foregoing description to indicate the scope of the invention.

What is claimed is:

1. A gate driver comprising:
   a plurality of stages connected to each other in a cascade manner,
   wherein each of the stages comprises:
   an input unit which connects a first input terminal and a first node, and comprises a first input transistor and a second input transistor,
   wherein an output terminal of the first input transistor and an input terminal of the second input transistor are connected to a second node, and
   the input unit further comprises a storage capacitor which directly connects the first input terminal and the second node, and
   wherein each of the stages further comprises:
   an inverter unit which connects a clock terminal and a third node, and comprises a plurality of transistors;
   an output unit which connects the first node and a first output terminal, and comprises an output transistor and an output capacitor;
   a carry signal generation unit which connects the clock terminal and a second output terminal;
   a noise elimination unit which connects a second power source terminal and the second output terminal, and comprises a transistor; and
   a pull-down unit which applies a voltage of a first power source terminal to the first output terminal or the second output terminal in response to a signal transmitted to a second input terminal.

2. The gate driver of claim 1, wherein
   a carry signal of a previous stage is transmitted to the first input terminal of a current stage,
   a carry signal of a next stage is transmitted to the second input terminal of the current stage,
   the first output terminal of the current stage outputs a gate signal of the current stage, and
   the second output terminal of the current stage outputs a carry signal of the current stage.

3. The gate driver of claim 1, wherein
   a clock signal is transmitted to the clock terminal,
   a first gate-off signal is transmitted to the first power source terminal, and
   a second gate-off signal is transmitted to the second power source terminal.

4. The gate driver of claim 1, wherein
   input terminals of the plurality of transistors of the inverter unit are connected to the clock terminal, and
   output terminals of the plurality of transistors of the inverter unit are connected to the second power source terminal.

5. The gate driver of claim 1, wherein each of the first and second transistors of the input unit, the plurality of transistors of the inverter unit, the output transistor of the output unit and the transistor of the noise elimination unit comprises an oxide semiconductor.

6. The gate driver of claim 1, wherein a control terminal of the first input transistor and a control terminal of the second input transistor are diode-connected to an input terminal of the first input transistor and the input terminal of the second input transistor.

7. A gate driver comprising:
   a plurality of stages connected to each other in a cascade manner,
   wherein each of the stages comprises:
   an input unit which connects a first input terminal and a first node, and comprises a first input transistor and a second input transistor,
   wherein
   an output terminal of the first input transistor and an input terminal of the second input transistor are connected to a second node, and
   the input unit further comprises a storage capacitor which directly connects a clock terminal and the second node, and
   wherein each of the stages further comprises:
   an inverter unit which connects the clock terminal and a third node, and comprises a plurality of transistors;

an output unit which connects the first node and a first output terminal and comprises an output transistor and an output capacitor;
a carry signal generation unit which connects the clock terminal and a second output terminal;
a noise elimination unit which connects a second power source terminal and the second output terminal, and comprises a transistor; and
a pull-down unit which applies a voltage of a first power source terminal to the first output terminal or the second output terminal in response to a signal transmitted to a second input terminal.

8. The gate driver of claim 7, wherein
a carry signal of a previous stage is transmitted to the first input terminal of a current stage,
a carry signal of a next stage is transmitted to the second input terminal of the current stage,
the first output terminal of the current stage outputs a gate signal of the current stage, and
the second output terminal of the current stage outputs a carry signal of the current stage.

9. The gate driver of claim 7, wherein
a clock signal is transmitted to the clock terminal,
a first gate-off signal is transmitted to the first power source terminal, and
a second gate-off signal is transmitted to the second power source terminal.

10. The gate driver of claim 7, wherein
input terminals of the plurality of transistors of the inverter unit are connected to the clock terminal, and
output terminals of the plurality of transistors of the inverter unit are connected to the second power source terminal.

11. The gate driver of claim 7, wherein each of the first and second transistors of the input unit, the plurality of transistors of the inverter unit, the output transistor of the output unit and the transistor of the noise elimination unit comprise an oxide semiconductor.

12. The gate driver of claim 7, wherein a control terminal of the first input transistor and a control terminal of the second input transistor are diode-connected to an input terminal of the first input transistor and the input terminal of the second input transistor.

13. A display device comprising:
a display panel; and
a gate driver which provides gate signals to the display panel,
wherein the gate driver comprises:
a plurality of stages connected to each other in a cascade manner,
wherein each of the stages comprises:

an input unit which connects a first input terminal and a first node, and comprises a first input transistor and a second input transistor,
wherein
an output terminal of the first input transistor and an input terminal of the second input transistor are connected to a second node, and
the input unit comprises a storage capacitor which directly connects the first input terminal and the second node, and
wherein each of the stages further comprises:
an inverter unit which connects a clock terminal and a third node and comprises a plurality of transistors;
an output unit which connects the first node and a first output terminal, and comprises an output transistor and an output capacitor;
a carry signal generation unit which connects the clock terminal and a second output terminal;
a noise elimination unit which connects a second power source terminal and the second output terminal, and comprises a transistor; and
a pull-down unit which applies a voltage of a first power source terminal to the first output terminal or the second output terminal in response to a signal transmitted to a second input terminal.

14. The display device of claim 13, wherein
a carry signal of a previous stage is transmitted to the first input terminal of a current stage,
a carry signal of a next stage is transmitted to the second input terminal of the current stage,
the first output terminal of the current stage outputs a gate signal of the current stage, and
the second output terminal of the current stage outputs a carry signal of the current stage.

15. The display device of claim 13, wherein
a clock signal is transmitted to the clock terminal,
a first gate-off signal is transmitted to the first power source terminal, and
a second gate-off signal is transmitted to the second power source terminal.

16. The display device of claim 13, wherein each of the first and second transistors of the input unit, the plurality of transistors of the inverter unit, the output transistor of the output unit and the transistor of the noise elimination unit comprises an oxide semiconductor.

17. The display device of claim 13, wherein a control terminal of the first input transistor and a control terminal of the second input transistor are diode-connected to an input terminal of the first input transistor and the input terminal of the second input transistor.

* * * * *